(12) United States Patent
Hatakeyama et al.

(10) Patent No.: US 6,274,286 B1
(45) Date of Patent: *Aug. 14, 2001

(54) RESIST COMPOSITIONS

(75) Inventors: Jun Hatakeyama; Tsunehiro Nishi; Takeshi Nagata; Shigehiro Nagura, all of Nakakubiki-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/105,003

(22) Filed: Jun. 26, 1998

(30) Foreign Application Priority Data

Jun. 26, 1997 (JP) ................................. 9-185814

(51) Int. Cl.$^7$ ................................. G03F 7/004
(52) U.S. Cl. .................... 430/189; 430/270.1; 430/905
(58) Field of Search .................... 430/270.1, 905, 430/189

(56) References Cited

U.S. PATENT DOCUMENTS

| | | | |
|---|---|---|---|
| 6,027,854 | * 2/2000 | Nishi et al. | 430/270.1 |
| 6,048,661 | * 4/2000 | Nishi et al. | 430/270.1 |

FOREIGN PATENT DOCUMENTS

| | | |
|---|---|---|
| 369645 | 11/1989 | (EP) . |
| 558280 | 2/1993 | (EP) . |
| 660187 | 12/1994 | (EP) . |
| 780732 | 12/1996 | (EP) . |
| 63-149640 | 6/1988 | (JP) . |
| 5-232706 | 9/1993 | (JP) . |
| 5-289322 | 11/1993 | (JP) . |
| 6-266111 | 9/1994 | (JP) . |
| 7-092678 | 4/1995 | (JP) . |
| 7-120929 | 5/1995 | (JP) . |
| 7-128859 | 5/1995 | (JP) . |
| 7-134419 | 5/1995 | (JP) . |

* cited by examiner

Primary Examiner—John S. Chu
(74) Attorney, Agent, or Firm—Millen, White, Zelano & Branigan, P.C.

(57) ABSTRACT

A chemically amplified positive resist composition comprising at least one basic compound of the following general formula (1) or (2):

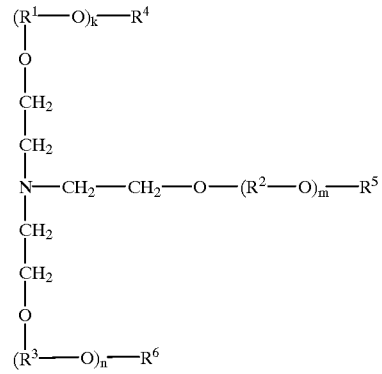

(1)

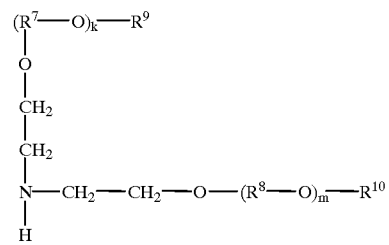

(2)

wherein $R^1$, $R^2$, $R^3$, $R^7$, and $R^8$ are independently normal, branched or cyclic alkylene groups having 1 to 20 carbon atoms, $R^4$, $R^5$, $R^6$, $R^9$, and $R^{10}$ are independently hydrogen, alkyl groups having 1 to 20 carbon atoms or amino groups, $R^4$ and $R^5$, $R^5$ and $R^6$, $R^4$ and $R^6$, or $R^8$, $R^5$ and $R^5$, and $R^9$ and $R^{10}$, taken together, may form a ring, letters k, m and n are integers of 0 to 20, with the proviso that hydrogen is excluded from $R^4$, $R^5$, $R^6$, $R^9$ and $R^{10}$ when k, m or n is equal to 0.

The resist compositions of the present invention are effective for preventing resist films from thinning and for increasing the focus margin of an isolated pattern.

52 Claims, No Drawings

RESIST COMPOSITIONS

BACKGROUND OF THE INVENTION

1. Field of the Invention

This invention relates to a novel chemically amplified resist material suitable for microfabrication.

2. Prior Art

Deep-ultraviolet lithography, one of a number of efforts currently being made to achieve a finer pattern rule in the drive for higher integration and operating speeds in LSI devices, is thought to hold particular promise as the next generation in microfabrication technology. Deep-UV lithography is capable of pattern generation to dimensions of 0.3 μm or less and, when a resist material having low light absorption is used, can form patterns with sidewalls that are nearly vertical to the substrate. One technology that has attracted a good deal of attention recently utilizes a high-intensity KrF excimer laser as the deep-UV light source. Resist materials with low light absorption and high sensitivity are needed to successfully apply this technology to large-volume production.

In light of this, acid-catalyzed chemically amplified positive resist materials were recently developed as disclosed in JP-B 27660/1990, JP-A 27829/1988, U.S. Pat. Nos. 4,491,628 and 5,310,619. Because of their excellent properties including sensitivity, resolution and dry-etching resistance, they are especially promising as resist materials for deep-UV lithography.

Chemically amplified resist materials, however, suffer from a post-exposure delay (PED) problem and a footing phenomenon. The PED problem is that in lithographic process, line patterns would have a T-top profile, that is, patterns become thick at the top if the leave-to-stand or delay time from exposure to post-exposure baking (PEB) is extended. The footing is a phenomenon that a pattern on a basic substrate, especially silicon nitride or titanium nitride substrate becomes widened in proximity to the substrate. It is believed that the T-top profile arises because the solubility of resist film is reduced in proximity to its surface whereas the footing arises because the solubility of resist film is reduced in proximity to the substrate. There also occurs a problem that dark reaction of eliminating acid labile groups proceeds in a PED duration from exposure to PEB, reducing the dimension of lines to be left. These problems are serious enough to prevent chemically amplified positive resist materials from practical application. Moreover, these problems not only complicate dimensional control in the lithographic process, but also adversely affect dimensional control in the processing of substrates using dry etching. In this regard, reference is made to W. Hinsberg et al., J. Photopolym. Sci. Technol., 6 (4), 535–546 (1993) and T. Kumada et al., J. Photopolym., Sci. Technol., 6 (4), 571–574 (1993).

It is understood that in these resist materials, air-borne basic compounds largely participate in the PED or T-top profile problem and basic compounds on the substrate surface largely participate in the footing phenomenon. Light exposure generates acid at the resist surface which is deactivated through reaction with air-borne basic compounds. As the leave-to-stand or delay time from exposure to PEB is extended, the amount of thus deactivated acid increases to retard decomposition of acid labile groups. An insolubilized layer is then formed at the resist surface, resulting in a T-top profile.

It is well known to blend basic compounds in resist materials to suppress the influence of air-borne basic compounds and to restrain the acid generated thereby from diffusing into unexposed portions, thereby improving PED, rectangularity and resolution.

For example, JP-A 289322/1993 discloses the addition of imidazole amines, JP-A 266111/1994 discloses the addition of imidazole, alanine, adenine, and adenosine, JP-A 120929/1995 discloses the addition of amines having pKa 6 or lower, JP-A 134419/1995 discloses the addition of pyridine compounds, and JP-A 128859/1995 discloses the addition of polyvinyl pyridine.

Through extensive investigations, we found that bases with high pKa were more effective for complementing for acids and hence, for improving the PED, eliminating the footing on basic substrates, and improving the resolution. In contrast, aromatic amines generally having low pKa were found little effective.

However, it is not true that higher pKa leads to better results. Various alkylamines as described in JP-A 149640/1988, 232706/1993 and 92678/1995, proton sponge known as a ultra-strong base disclosed in U.S. Pat. No. 5,609,989, 1,5-diazabicyclo[4.3.0]-5-nonene (DBN), 1,8-diazabicyclo [5.4.0]-7-undecene (DBU), cyclic alkylamines or quaternary amines such as tetramethylammonium hydroxide, some of which are shown below, were not fully effective.

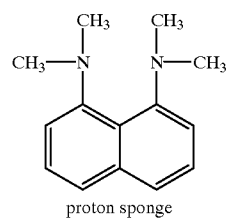

proton sponge

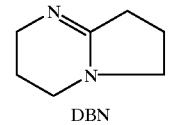

DBN

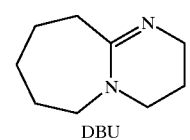

DBU

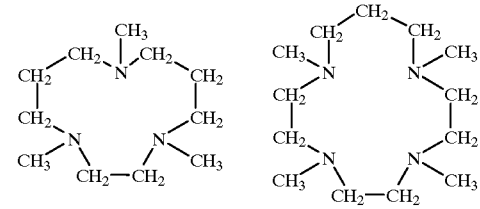

In the case of negative working resist materials, there arise different problems from the problems of positive working resist materials. For example, PED problems of negative resists are that the top of a pattern is rounded due to film thinning and that a pattern on a basic substrate is thinned near the substrate, resulting in an undercut profile. Such an undercut pattern will readily turn down. The rounded or undercut portion of the pattern is formed by the progress of dissolution due to retarded crosslinking reaction.

SUMMARY OF THE INVENTION

An object of the invention is to provide a resist composition which is effective for preventing a resist film from thinning and for expanding the focus margin.

We have found that polyether group-bearing amines having the following general formula (1) or (2) are most effective for preventing a resist film from thinning and also effective for expanding the focus margin of an isolated pattern.

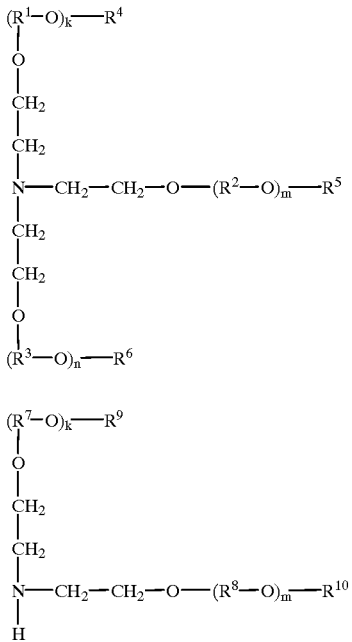

Herein, $R^1$, $R^2$, $R^3$, $R^7$, and $R^8$ are independently normal, branched or cyclic alkylene groups having 1 to 20 carbon atoms, $R^4$, $R^5$, $R^6$, $R^9$, and $R^{10}$ are independently hydrogen, alkyl groups having 1 to 20 carbon atoms or amino groups, $R^4$ and $R^5$, $R^5$ and $R^6$, $R^4$ and $R^6$, or $R^4$, $R^5$ and $R^6$, and $R^9$ and $R^{10}$, taken together, may form a ring, letters k, m and n are integers of 0 to 20, with the proviso that hydrogen is excluded from $R^4$, $R^5$, $R^6$, $R^9$ and $R^{10}$ when k, m or n is equal to 0.

The present invention is as defined below as (I) to (VII).

(I) A resist composition comprising at least one basic compound of the following general formula (1) or (2):

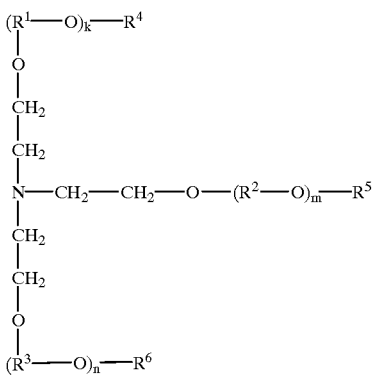

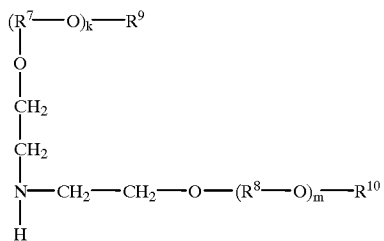

wherein $R^1$, $R^2$, $R^3$, $R^7$, and $R^8$ are independently normal, branched or cyclic alkylene groups having 1 to 20 carbon atoms, $R^4$, $R^5$, $R^6$, $R^9$, and $R^{10}$ are independently hydrogen, alkyl groups having 1 to 20 carbon atoms or amino groups, $R^4$ and $R^5$, $R^5$ and $R^6$, $R^4$ and $R^6$, or $R^4$, $R^5$ and $R^6$, and $R^9$ and $R^{10}$, taken together, may form a ring, letters k, m and n are integers of 0 to 20, with the proviso that hydrogen is excluded from $R^4$, $R^5$, $R^6$, $R^9$ and $R^{10}$ when k, m or n is equal to 0.

(II) A resist composition comprising
   (A) the basic compound of (I),
   (B) an organic solvent,
   (C) a base resin having an acidic functional group protected with an acid labile group, which is substantially alkali insoluble, but becomes alkali soluble when the acid labile group is eliminated, and
   (D) a photoacid generator.

(III) The resist composition of (I) wherein in the base resin (C), the acid labile group is at least one group selected from the group consisting of groups of the following general formula (3), groups of the following general formula (4), tertiary alkyl groups of 4 to 20 carbon atoms, trialkylsilyl groups whose alkyl groups each have 1 to 6 carbon atoms, and oxoalkyl groups of 4 to 20 carbon atoms,

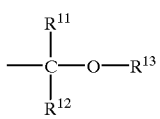

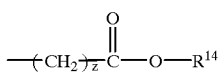

wherein $R^{11}$ and $R^{12}$ are independently hydrogen or normal, branched or cyclic alkyl groups of 1 to 18 carbon atoms, $R^{13}$ is a monovalent hydrocarbon group of 1 to 18 carbon atoms which may have a hetero atom, or $R^{11}$ and $R^{12}$, $R^{11}$ and $R^{13}$, or $R^{12}$ and $R^{13}$, taken together, may form a ring, with the proviso that each of $R^{11}$, $R^{12}$ and $R^{13}$ is a normal or branched alkylene group of 1 to 18 carbon atoms when they form a ring, $R^{14}$ is a tertiary alkyl group of 1 to 12 carbon atoms, a trialkylsilyl group whose alkyl groups each have 1 to 6 carbon atoms, an oxoalkyl group of 4 to 20 carbon atoms or a group of formula (3), and letter z is an integer of 0 to 6.

(IV) A resist composition comprising
   (A) the basic compound of (I),
   (B) an organic solvent, (C) a base resin having phenolic hydroxyl groups in which at least 10 mol % of the hydrogen atoms of the phenolic hydroxyl groups are substituted with acid labile groups of the following general formula (3):

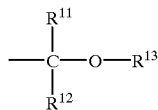
(3)

wherein $R^{11}$ and $R^{12}$ are independently hydrogen or normal, branched or cyclic alkyl groups of 1 to 18 carbon atoms, $R^{13}$ is a monovalent hydrocarbon group of 1 to 18 carbon atoms which may have a heteroatom, or $R^{11}$ and $R^{12}$, $R^{12}$ and $R^{13}$, or $R^{12}$ and $R^{13}$ may form a ring, each of $R^{11}$, $R^{12}$ and $R^{13}$ is a normal or branched alkylene group of 1 to 18 carbon atoms when they form a ring, said base resin being crosslinked within a molecule and/or between molecules, in a proportion of more than 0 mol % of the hydrogen atoms of the remaining phenolic hydroxyl groups, with crosslinking groups having C—O—C linkages represented by the following general formula (5a) or (5b):

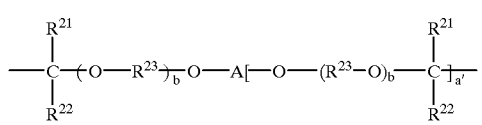
(5a)

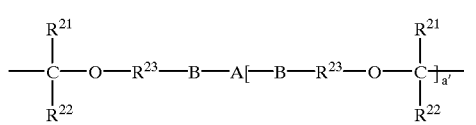
(5b)

wherein each of $R^{21}$ and $R^{22}$ is hydrogen or a normal, branched or cyclic alkyl group of 1 to 8 carbon atoms, or $R^{21}$ and $R^{22}$, taken together, may form a ring, with the proviso that each of $R^{21}$ and $R^{22}$ is a normal or branched alkylene group of 1 to 8 carbon atoms when they form a ring, R23 is a normal, branched or cyclic alkylene group of 1 to 10 carbon atoms, letter b is 0 or an integer of 1 to 10, A is an a-valent aliphatic or alicyclic saturated hydrocarbon group, aromatic hydrocarbon group or heterocyclic group of 1 to 50 carbon atoms, which may have an intervening heteroatom and in which some of the hydrogen atom attached to carbon atoms may be replaced by hydroxyl, carboxyl, carbonyl or fluorine, B is —CO—O—, —NHCO—O— or —NHCONH—, letter a is an integer of 2 to 8, and a' is an integer of 1 to 7, said base resin having a weight average molecular weight of 5,000 to 100,000, and (D) a photoacid generator.

(V) A resist composition comprising
  (A) the basic compound of (I),
  (B) an organic solvent,
  (C) the base resin of (II), (III) or (IV),
  (D) a photoacid generator, and
  (E) a polymer having a weight average molecular weight of 3,000 to 300,000 and comprising recurring units of the following general formula (6):

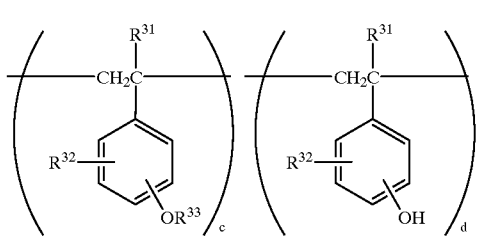
(6)

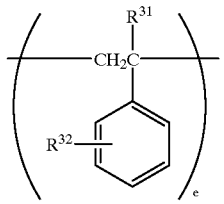

wherein $R^{31}$ is hydrogen or methyl, $R^{32}$ is a hydrogen or normal, branched or cyclic alkyl group of 1 to 8 carbon atoms, $R^{33}$ is an acid labile group different from —$CR^{11}R^{12}OR^{13}$, letters c and e are 0 or a positive number, d is a positive number, c+d+e=1, and $0.5 \leq d/(c+d+e) \leq 1.0$.

(VI) The resist composition of any one of (II) to (V) further comprising (F) a dissolution inhibitor having an acid labile group.

(VII) A resist composition comprising
  (A) the basic compound of (I),
  (B) an organic solvent,
  (G) an alkali soluble resin,
  (D) a photoacid generator, and
  (H) a compound crosslinkable under the action of acid.

DETAILED DESCRIPTION OF THE INVENTION

The resist composition of the invention has blended therein a basic compound (A) which is at least one of basic compounds of the following general formulae (1) and (2).

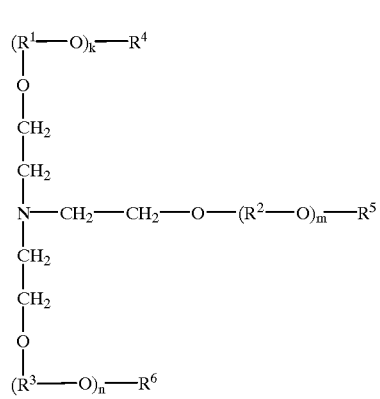
(1)

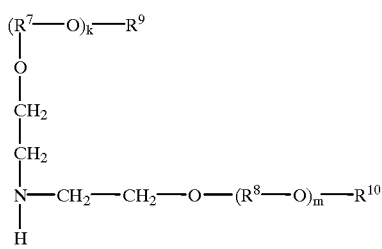
(2)

Herein, $R^1$, $R^2$, $R^3$, $R^7$, and $R^8$ are independently normal, branched or cyclic alkylene groups having 1 to 20 carbon atoms, $R^4$, $R^5$, $R^6$, $R^9$, and $R^{10}$ are independently hydrogen, alkyl groups having 1 to 20 carbon atoms or amino groups. Alternatively, $R^4$ and $R^5$, $R^5$ and $R^6$, $R^4$ and $R^6$, or $R^4$, $R^5$ and $R^6$, and $R^9$ and $R^{10}$, taken together, form a ring. Letters k, m and n are integers of 0 to 20, with the proviso that hydrogen is excluded from $R^4$, $R^5$, $R^6$, $R^9$ and $R^{10}$ when k, m or n is equal to 0.

The alkylene groups represented by $R^1$, $R^2$, $R^3$, $R^7$, and $R^8$ are those of 1 to 20 carbon atoms, preferably 1 to 10 carbon atoms, more preferably 1 to 8 carbon atoms, for example, methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^4$, $R^5$, $R^6$, $R^9$, and $R^{10}$ are those of 1 to 20 carbon atoms, preferably 1 to 8 carbon atoms, more preferably 1 to 6 carbon atoms, and they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

When $R^4$ and $R^5$, $R^5$ and $R^6$, $R^4$ and $R^6$, or $R^4$, $R^5$ and $R^6$, and $R^9$ and $R^{10}$ together form a ring, $R^4$, $R^5$, $R^6$, $R^9$, and $R^{10}$ each are an alkylene group preferably having 1 to 20 carbon atoms, more preferably 1 to 8 carbon atoms, further preferably 1 to 6 carbon atoms, and the ring may have branched therefrom an alkyl group of 1 to 6 carbon atoms, preferably 1 to 4 carbon atoms.

Letters k, m and n are integers of 0 to 20, preferably 1 to 10, and more preferably 1 to 8.

Illustrative, non-limiting, examples of the basic compounds of formulae (1) and (2) are given below.

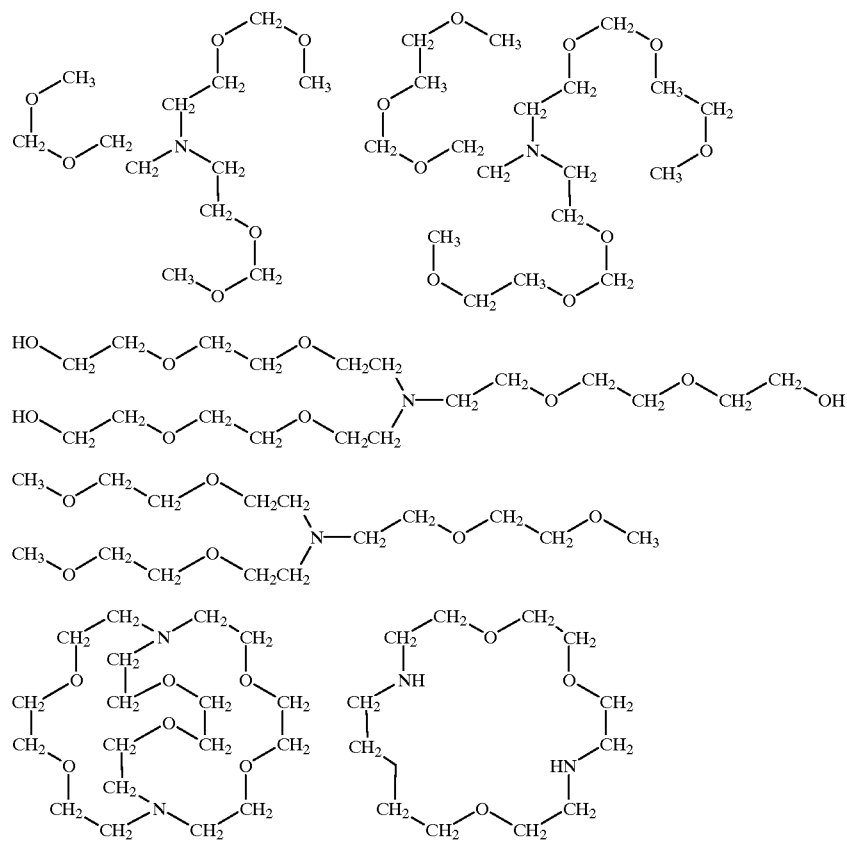

-continued

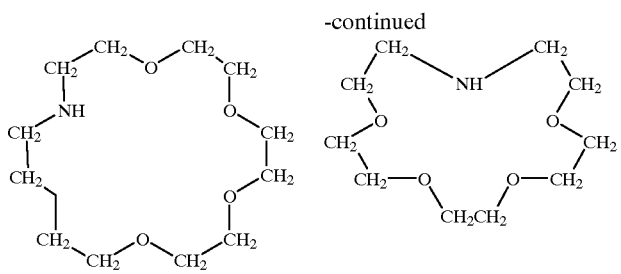

The above-described basic compounds can be prepared, for example, by reacting triethanolamine with chloromethyl ethers in the presence of bases as shown by the following reaction scheme.

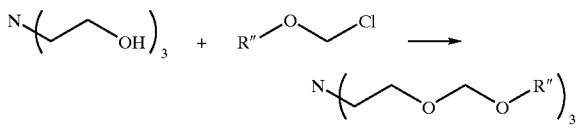

Herein, R" is $R^4$, $R^5$ or $R^6$.

This reaction may be carried out in a solvent such as tetrahydrofuran, N,N-dimethylformamide or dimethyl sulfoxide and at a temperature of −78° C. to 100° C., especially −20° C. to 80° C. The reaction time is usually about ½ to 24 hours.

In the reaction, organic bases having a higher pKa value than triethanolamine, such as triethylamine and diisopropylamine are preferably used as well as inorganic bases such as sodium hydride and potassium t-butoxide. The chloromethyl ethers are as defined above and to name a few, include chloromethyl methyl ether (MOMCl) and chloromethyl (2-methoxyethoxy)methyl ether (MEMCl). These chloromethyl ethers can be obtained by well-known methods, for example, by condensing a corresponding alcohol with formaldehyde or hydrogen chloride, by methylthiomethylating a corresponding alcohol and chloro-decomposing C—S bonds with Cl/$CCl_4$, and by chlorinating a corresponding methyl ether with sulfuryl chloride ($SO_2Cl_2$).

The basic compounds of formula (2) may also be synthesized by methods similar to the above-described methods.

The resist compositions of the invention contain one or more of the basic compounds of formulae (1) and (2). The resist compositions may be either positive or negative working although they are preferably of the chemical amplification type.

Included in the resist compositions of the invention are (I) chemically amplified positive working resist compositions comprising
(A) at least one basic compound of formula (1) or (2),
(B) an organic solvent,
(C) a base resin, and
(D) a photoacid generator, and optionally
(E) a polymer different from component (C) and forming a base resin together with component (C) and
(F) a dissolution inhibitor having an acid labile group, and
(II) chemically amplified negative working resist compositions comprising
(A) at least one basic compound of formula (1) or (2),
(B) an organic solvent,
(G) an alkali soluble resin (or base resin),
(D) a photoacid generator, and
(H) a compound crosslinkable under the action of acid.

In the resist compositions, the basic compound of formula (1) or (2) is preferably blended as component (A) in an amount of 0.001 to 10 parts by weight, more preferably 0.01 to 1 part by weight, per 100 parts by weight of the entire base resin. Less than 0.001 part of the basic compound is not effective for preventing film thinning and expanding the focus margin whereas more than 10 parts of the basic compound can cause a decline of sensitivity.

Component (B) in the resist composition of the invention is an organic solvent, which may be any organic solvent in which the photoacid generator, base resin, dissolution inhibitor and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in admixture of two or more. Of the above organic solvents, diethylene glycol dimethyl ether and 1-ethoxy-2-propanol in which the photoacid generator is most soluble, propylene glycol monomethyl ether acetate which is a safe solvent, and mixtures thereof are preferred.

An appropriate amount of the organic solvent used is about 100 to 5,000 parts, and especially about 300 to 2,000 parts by weight per 100 parts by weight of the base resin which is the sum of components (C) and (E) to be described later (the base resin of (C) and (E) combined being the same throughout the specification).

Component (C) is a base resin having an acidic functional group protected with an acid labile group, which is substantially alkali insoluble, but becomes alkali soluble when the acid labile group is eliminated. By the term "substantially alkali insoluble," it is meant that the resin is insoluble or difficultly soluble in alkali. The base resin is preferably polyhydroxystyrene or derivatives thereof in which some of the phenolic hydroxyl groups are protected with acid labile groups. The base resin should preferably have a weight average molecular weight (Mw) of 5,000 to 100,000. At a molecular weight of less than 5,000, the film formability and resolution would be unacceptable, and at more than 100,000, the resolution would be poor.

In the base resin (C), the acid labile group is preferably at least one group selected from the group consisting of groups of the following general formula (3), groups of the following general formula (4), tertiary alkyl groups of 4 to 20 carbon atoms, trialkylsilyl groups whose alkyl groups each have 1 to 6 carbon atoms, and oxoalkyl groups of 4 to 20 carbon atoms. It is preferred that at least 0 mol %, more preferably at least 12 mol %, and further preferably at least 15 mol % of the hydrogen atoms of the phenolic hydroxyl groups in the base resin be replaced by acid labile groups of formula (3) or the like. It is noted that the upper limit of replacement of the hydrogen atoms of the phenolic hydroxyl groups in the base resin by acid labile groups of formula (3) or the like is preferably 80 mol %, and especially 70%.

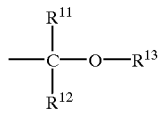

(3)

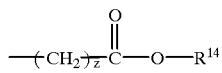

(4)

Herein, $R^{11}$ and $R^{12}$ each are hydrogen or a normal, branched or cyclic alkyl group of 1 to 18 carbon atoms, $R^{13}$ is a monovalent hydrocarbon group of 1 to 18 carbon atoms which may have a hetero atom. Alternatively, $R^{11}$ and $R^{12}$, $R^{11}$ and $R^{13}$, or $R^{12}$ and $R^{13}$, taken together, form a ring. Each of $R^{11}$, $R^{12}$ and $R^{13}$ is a normal or branched alkylene group of 1 to 18 carbon atoms when they form a ring. $R^{14}$ is a tertiary alkyl group of 1 to 12 carbon atoms, a trialkylsilyl group hose alkyl groups each have 1 to 6 carbon atoms, an oxoalkyl group of 4 to 20 carbon atoms or a group of formula (3). Letter z is an integer of 0 to 6.

Examples of the alkyl groups having 1 to 18 carbon atoms represented by $R^{11}$ and $R^{12}$ include methyl, ethyl, n-propyl, isopropyl, n-butyl, isobutyl, tert-butyl, n-pentyl, isopentyl, hexyl, nonyl, decyl, cyclopentyl, and cyclohexyl.

Examples of the hydrocarbon group represented by $R^{13}$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

—(CH$_2$)$_4$OH
—(CH$_2$)$_2$O(CH$_2$)$_3$CH$_3$

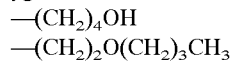

—(CH$_2$)$_2$O(CH$_2$)$_2$OH
—(CH$_2$)$_6$OH

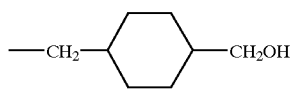

Examples of the tertiary alkyl group of 4 to 20 carbon atoms represented by $R^{14}$ include tert-butyl, 1-methylcyclohexyl, 2-(2-methyl)adamantyl and tert-amyl groups.

Examples of the trialkylsilyl group whose alkyl groups each have 1 to 6 carbon atoms include trimethylsilyl, triethylsilyl and dimethyl-tert-butyl groups. Examples of the oxoalkyl group of 4 to 20 carbon atoms include 3-oxocyclohexyl and groups of the following formulae.

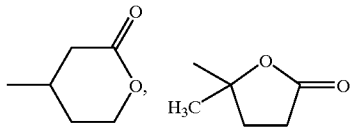

When $R^{11}$ and $R^{12}$, $R^{11}$ and $R^{13}$, or $R^{12}$ and $R^{13}$ form a ring, $R^{11}$, $R^{12}$ and $R^{13}$ each are an alkylene group preferably having 1 to 18 carbon atoms, more preferably 1 to 12 carbon atoms, further preferably 1 to 8 carbon atoms. Further the ring may have branched therefrom an alkyl group of 1 to 8 carbon atoms, especially 1 to 4 carbon atoms.

Illustrative examples of the acid labile groups having formula (3) include normal and branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-cyclohexyloxyethyl, 1-methoxypropyl, 1-ethoxypropyl, 1-methoxy-1-methylethyl, and 1-ethoxy-1-methylethyl; and cyclic acetals such as 2-tetrahydrofuranyl and 2-tetrahydropyranyl. Of these, 1-ethoxyethyl, 1-n-butoxyethyl and 1-ethoxypropyl are preferable.

Illustrative examples of the acid labile groups having formula (4) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydro-pyranyloxycarbonylmethyl, and 2-tetrahydrofuranyloxycarbonylmethyl groups. Examples of the tert-alkyl groups, trialkylsilyl groups whose alkyl groups each have 1 to 6 carbon atoms, and oxoalkyl groups of 4 to 20 carbon atoms in the formula (4) include the same as explained in $R^{14}$.

Of the above base resins, those of the following formula (6A) are especially preferred.

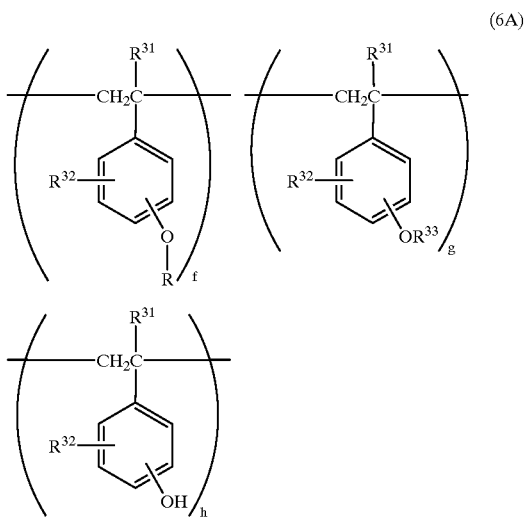

(6A)

In formula (6A), R is an acid labile group of the above formula (3) and/or (4), $R^{31}$ is hydrogen or methyl, $R^{32}$ is hydrogen or a normal, branched or cyclic alkyl group of 1 to 8 carbon atoms, and $R^{33}$ is an acid labile group different from formula (3) or (4), for example, alkoxy groups such as tert-butoxy, alkylsiloxy groups such as trimethylsilyl, and tert-butyl derivatives such as tert-butoxycarbonyl and tert-butoxycarbonylmethyl.

In formula (6A), f is a positive number, g is 0 or a positive number and h is a positive number, satisfying f+g+h=1. The value of f relative to the sum of f, g and h, which represents the proportion of acid labile groups of formula (3) or (4), is as described above while the values of g and h preferably satisfy $0 \leq g/(f+g+h) \leq 0.5$, more preferably $0 \leq g/(f+g+h) \leq 0.4$, and $0.45 \leq h/(f+g+h) \leq 0.9$, more preferably $0.6 \leq h/(f+g+h) \leq 0.8$. If the proportion of g relative to the sum exceeds 0.5, the proportion of h relative to the sum exceeds 0.9, or the proportion of h relative to the sum is below 0.4, the contrast of alkali dissolution rate would become low and the resolution become low. By properly selecting the values of f, g and h within the above-defined ranges, the size and configuration of a resist pattern can be controlled as desired.

More preferred base resin (C) is a base resin having phenolic hydroxyl groups in which some, especially at least 10 mol %, of the hydrogen atoms of the phenolic hydroxyl groups are substituted with acid labile groups of formula (3). The base resin is crosslinked within a molecule and/or between molecules, in a proportion of more than 0 mol %, preferably 0.2 to 30 mol %, more preferably 1 to 30 mol %, further preferably 3 to 20 mol %, of the hydrogen atoms of the remaining phenolic hydroxyl groups, with crosslinking groups having C—O—C linkages represented by the following general formula (5a) or (5b).

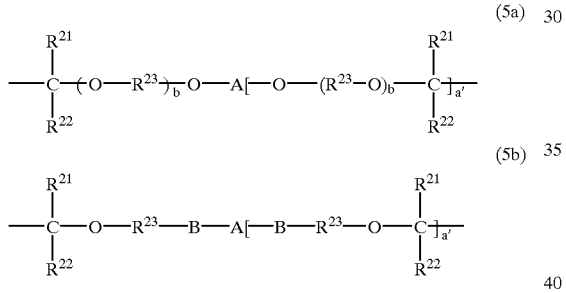

Herein, each of $R^{21}$ and $R^{22}$ is hydrogen or a normal, branched or cyclic alkyl group of 1 to 8 carbon atoms. Alternatively, $R^{21}$ and $R^{22}$, taken together, form a ring. Each of $R^{21}$ and $R^{22}$ is a normal or branched alkylene group of 1 to 8 carbon atoms when they form a ring. $R^{23}$ is a normal, branched or cyclic alkylene group of 1 to 10 carbon atoms. Letter b is 0 or an integer of 1 to 10. A is an a-valent aliphatic or alicyclic saturated hydrocarbon group, aromatic hydrocarbon group or heterocyclic group of 1 to 50 carbon atoms, which may have an intervening heteroatom and in which some of the hydrogen atom attached to carbon atoms may be replaced by hydroxyl, carboxyl, carbonyl or fluorine. B is —CO—O—, —NHCO—O— or —NHCONH—. Letter a is an integer of 2 to 8, and a' is an integer of 1 to 7.

Examples of the alkyl having 1 to 8 carbon atoms are the same as the above-mentioned. The rings formed by $R^{21}$ and $R^{22}$ are rings of 3 to 20 carbon atoms, especially 4 to 8 carbon atoms, which may have branched therefrom alkyl of 1 to 8 carbon atoms, especially 1 to 4 carbon atoms.

Examples of the a-valent aliphatic or alicyclic saturated hydrocarbon and aromatic hydrocarbon groups represented by A include substituted or unsubstituted alkylene groups preferably having 1 to 50 carbon atoms, and especially 1 to 40 carbon atoms, substituted or unsubstituted arylene groups preferably having 6 to 50 carbon atoms, and especially 6 to 40 carbon atoms (these alkylene and arylene groups may have an intervening hetero atom or group such as O, NH, $N(CH_3)$, S or $SO_2$, and where substituted, the substituents are hydroxyl, carboxyl, carbonyl and fluorine); combinations of these alkylene groups with these arylene groups; and a"-valent (wherein a" is an integer from 3 to 8) groups obtained by eliminating hydrogen atoms attached to carbon atoms in any of the foregoing groups. Additional examples include a-valent heterocyclic groups, and combinations of these heterocyclic groups with the foregoing hydrocarbon groups.

Illustrative examples of A are given below. —$CH_2CH_2$—, 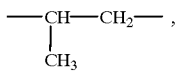

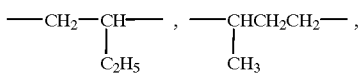

—$(CH_2)_4$—, 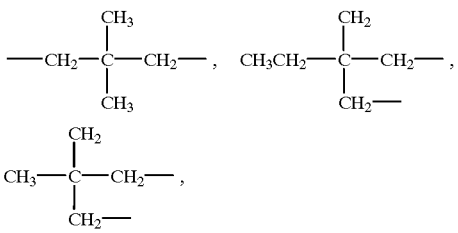

—$(CH_2)_5$—,

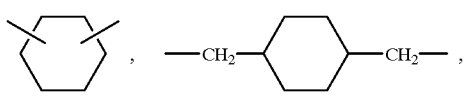

—$(CH_2)_6$—,

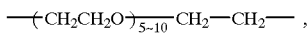

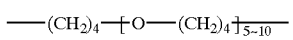

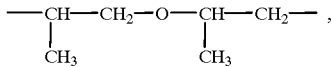

—$CH_2$—$CH_2$—O—$CH_2$—$CH_2$—, —$CH_2$—$CH_2$—O—$CH_2$—$CH_2$—O—$CH_2$—$CH_2$—,

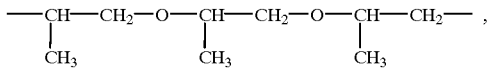

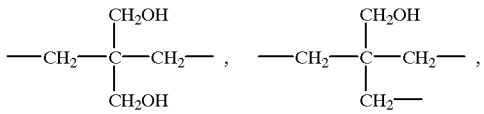

-continued
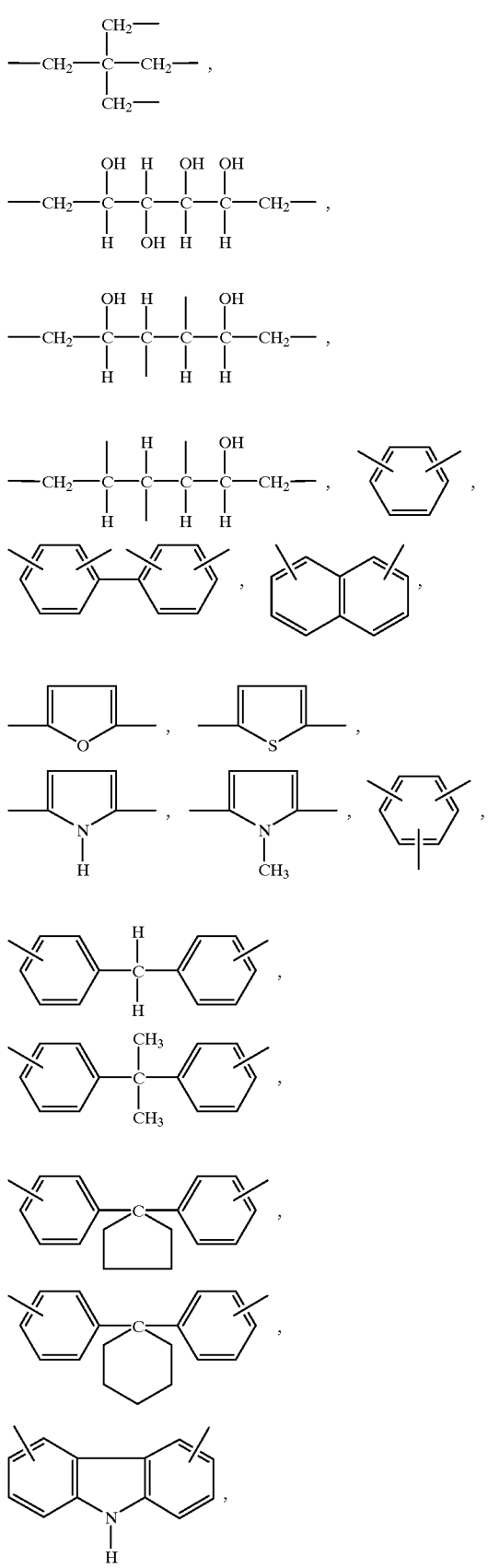
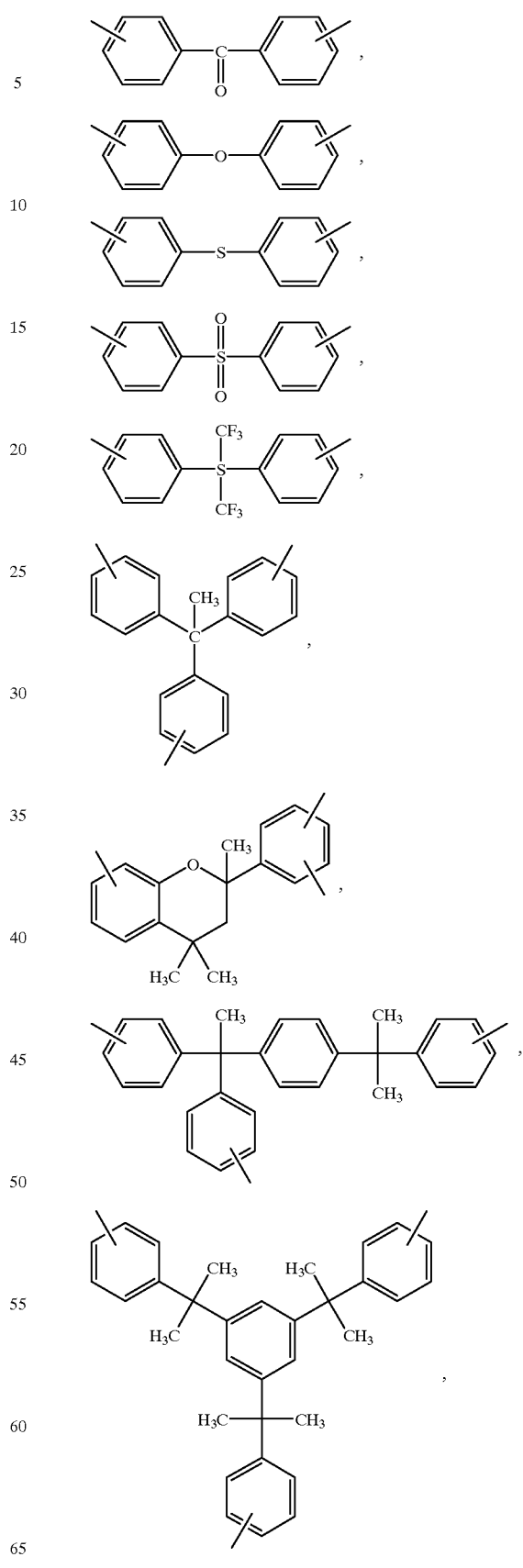

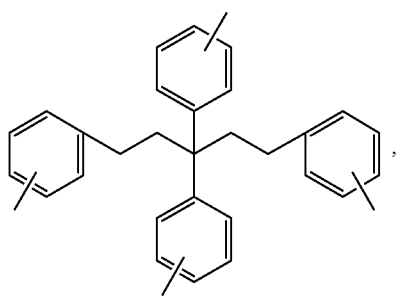
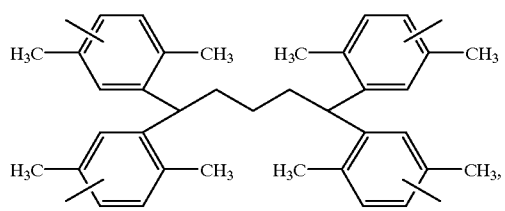
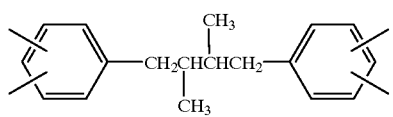
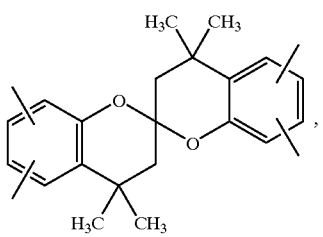
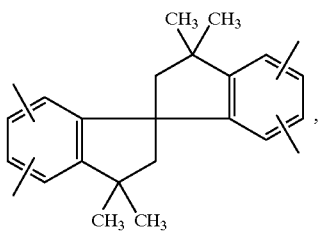
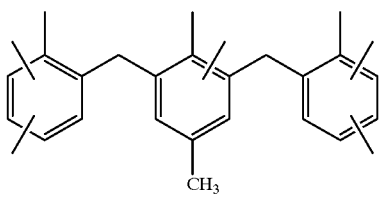
Of the above base resins, those of the following formulae (6B) and (6C) are preferred.
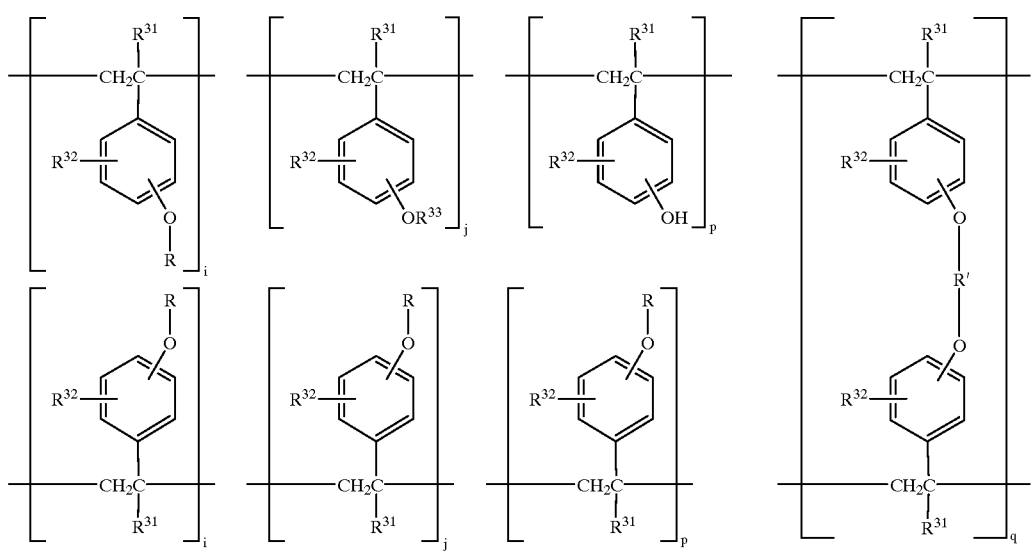

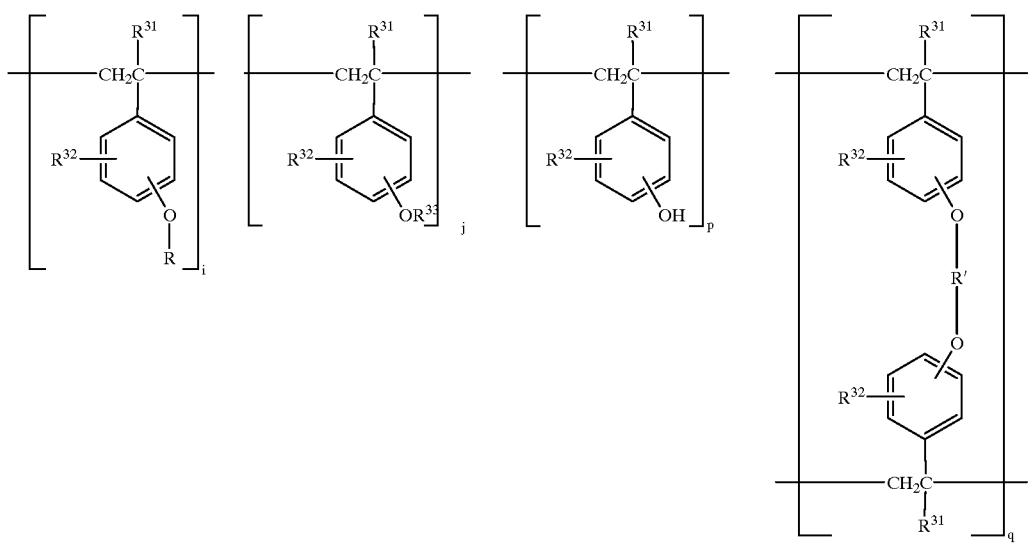

(6C)

In the formulae, R, $R^{31}$, $R^{32}$, and $R^{33}$ are as defined above. R' is a crosslinking group of formula (5a) or (5b).

Letter i is a positive number, j is 0 or a positive number and p and q are positive numbers, satisfying i+j+p+q=1. The values of i and q relative to the sum of i, j, p and q, which represent the proportions of acid labile groups of formula (3) or (4) and crosslinking groups of formula (5a) or (5b), respectively, are as described above while the values of j and p preferably satisfy $0 \leq j/(i+j+p+q) \leq 0.5$, more preferably $0 \leq j/(i+j+p+q) \leq 0.4$, and $0.4 \leq p/(i+j+p+q) \leq 0.9$, more preferably $0.6 \leq p/(i+j+p+q) \leq 0.8$. If the proportion of j relative to the sum exceeds 0.5, the proportion of p relative to the sum exceeds 0.9, or the proportion of p relative to the sum is below 0.4, the contrast of alkali dissolution rate would become low and the resolution become low. By properly selecting the values of i, j, p and q within the above-defined ranges, the size and configuration of a resist pattern can be controlled as desired.

The photoacid generators (D) used in the resist composition of the invention include onium salts of the general formula (7) below, diazomethane derivatives of formula (8), glyoxime derivatives of formula (9), β-ketosulfone derivatives, disulfone derivatives, nitrobenzylsulfonate derivatives, sulfonic acid ester derivatives, and imidoyl sulfonate derivatives.

$(R^{40})_r M^+ K^-$          (7)

In the formula, $R^{40}$ is a normal, branched or cyclic alkyl group of 1 to 12 carbon atoms, an aryl group of 6 to 12 carbon atoms, or an aralkyl group of 7 to 12 carbon atoms; $M^+$ is iodonium or sulfonium; $K^-$ is a non-nucleophilic counter-ion; and the letter r is equal to 2 or 3.

Illustrative examples of alkyl groups represented by $R^{40}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl and dimethylphenyl. Exemplary aralkyl groups include benzyl and phenethyl. Examples of the non-nucleophilic counter-ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

(8)

In the formula, $R^{41}$ and $R^{42}$ are normal, branched or cyclic alkyl or halogenated alkyl groups of 1 to 12 carbon atoms, aryl or halogenated aryl groups of 6 to 12 carbon, or aralkyl groups of 7 to 12 carbon.

Illustrative examples of alkyl groups represented by $R^{41}$ and $R^{42}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

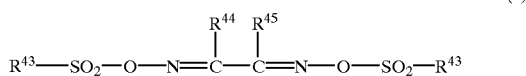

(9)

In the formula, $R^{43}$, $R^{44}$ and $R^{45}$ are normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{44}$ and $R^{45}$ may together form a cyclic structure with the proviso that when they form a cyclic structure, each is a normal or branched alkylene group of 1 to 6 carbon atoms.

The alkyl, halogenated alkyl, aryl, halogenated aryl, and aralkyl groups represented by $R^{43}$, $R^{44}$ and $R^{45}$ are exemplified by the same groups mentioned above for $R^{41}$ and $R^{42}$. Examples of alkylene groups represented by $R^{44}$ and $R^{45}$ include methylene, ethylene, propylene, butylene, and hexylene.

Illustrative examples of the photoacid generator include:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(secbutylsulfonyl) diazomethane, bis(n-propylsulfonyl)diazomethane, bis (isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in admixture of two or more. Onium salts are effective for improving rectangularity, while diazomethane derivatives and glyoxime derivatives are effective for reducing standing waves. The combination of an onium salt with a diazomethane or a glyoxime derivative allows for finer adjustment of the profile.

The photoacid generator is preferably added in an amount of 0.2 to 20 parts, and especially 0.5 to 10 parts by weight, per 100 parts by weight of the entire base resin. Less than 0.2 part of the photoacid generator would generate a less amount of acid upon exposure, leading to low sensitivity and resolution. More than 20 parts of the photoacid generator would lower the transmittance of resist to detract from resolution.

In addition to the polymer defined as component (C), the resist composition of the invention may contain another polymer or base resin as component (E). More specifically, component (E) is a polymer comprising recurring units of the following general formula (6) and having a weight average molecular weight of 3,000 to 300,000. The inclusion of component (E) is advantageous in that the size and shape of a resist pattern can be controlled as desired.

(6)

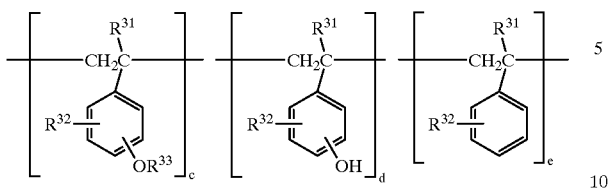

$R^{31}$, $R^{32}$ and $R^{33}$ are as defined above. Letters c and e are 0 or a positive number and d is a positive number, satisfying c+d+e=1. The compositional ratios preferably satisfy $0 \leq c/(c+d+e) \leq 0.6$, especially $0.1 \leq c/(c+d+e) \leq 0.5$ and $0.5 \leq d/(c+d+e) \leq 1.0$, especially $0.6 \leq d/(c+d+e) \leq 0.9$.

The polymer has a weight average molecular weight (Mw) of 3,000 to 300,000, preferably 5,000 to 30,000. With Mw<3,000, a resist composition would be less resistant to heat. With Mw>300,000, a resist composition would become low in alkali dissolution and hence, resolution.

In the base resin as component (E), a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, problems like footing, scum, and bridging of patterns by strings can occur after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 2.5, especially 1.0 to 1.5.

Preferably the base resin (E) is blended with the base resin (C) in a weight ratio of from 0:100 to 90:10, more preferably from 0:100 to 50:50. If the base resin (E) is blended in excess of this weight ratio range relative to the base resin (C), the desired effect of base resin (C) would be somewhat lost.

In the resist composition of the invention, a dissolution inhibitor may be added as component (F). Although any of well-known dissolution inhibitors may be used, low molecular weight compounds and polymers having at least one acid labile group (which is a group decomposable by acid) in a molecule are preferred. Exemplary low molecular weight compounds are bisphenol A derivatives, and especially bisphenol A derivatives in which hydroxyl groups are replaced by tert-butoxy, tert-butoxycarbonyloxy or ethoxyethyl groups. The amount of the dissolution inhibitor added is usually 0 to 50 parts by weight, preferably 10 to 30 parts by weight, per 100 parts by weight of the entire base resin.

Apart from the resist composition comprising components (A) to (F) defined above, the present invention also provides a resist composition comprising (A) a basic compound of formula (1) or (2), (B) an organic solvent, (D) a photoacid generator, (G) an alkali soluble resin (or base resin), and (H) a compound crosslinkable under the action of acid. Of these, components (A), (B) and (D) are the same as above.

The alkali soluble resin (G) is at least one polymer comprising recurring units of the following general formula (10), (11) or (12) in which the hydrogen atoms of hydroxyl groups and/or carboxyl groups are partially replaced by acid labile groups in an average proportion of more than 0 mol % to 80 mol % of the entirety of hydroxyl and carboxyl groups, the polymer having a weight average molecular weight of 3,000 to 300,000.

(10)

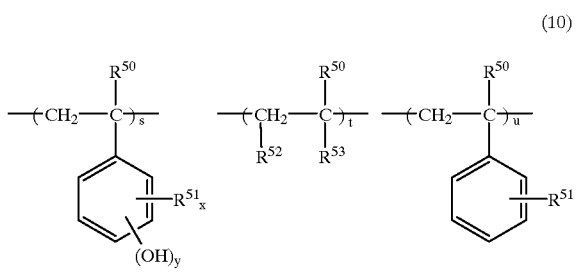

In formula (10), $R^{50}$ is hydrogen or methyl. $R^{51}$ is a hydrogen or normal, branched or cyclic alkyl group of 1 to 8 carbon atoms. $R^{52}$ is hydrogen or cyano. $R^{53}$ is hydrogen, cyano or —COOY wherein Y is hydrogen or normal, branched or cyclic alkyl of 1 to 6 carbon atoms. Alternatively, $R^{52}$ and $R^{53}$, taken together, form —CO—O—CO— or —CO—$NR^0$—CO— wherein $R^0$ is normal, branched or cyclic alkyl group of 1 to 8 carbon atoms or aryl of 6 to 10 carbon atoms. Letter x is 0 or a positive integer, y is a positive integer, satisfying $x+y \leq 5$. Letters s, t and u, representative of molar fractions, are 0 or positive numbers, satisfying s+t+u=1. Both s and t are not equal to 0 at the same time.

(11)

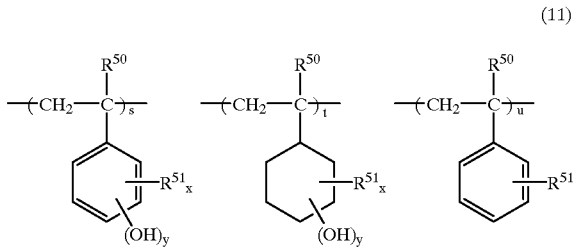

In formula (11), $R^{50}$, $R^{51}$, x and y are as defined above. Letters s, t and u are representative of molar fractions. s and t are positive numbers, and u is 0 or a positive number, satisfying s+t+u=1.

(12)

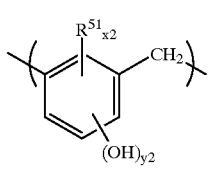

In formula (12), $R^{51}$ is as defined above. Letter $x_2$ is 0 or a positive integer, and $y_2$ is a positive integer, satisfying $x_2+y_2 \leq 4$.

The compounds crosslinkable under the action of acid (H) include aromatic compounds having a group —C($R^{60}R^{61}$)—$OR^{62}$, aromatic compounds having a group —CO—$R^{66}$, and aromatic compounds having a group —$CR^{67}$=$CR^{68}R^{69}$. $R^{60}$ and $R^{61}$, which may be the same or different, are hydrogen or alkyl of 1 to 4 carbon atoms; $R^{62}$ is hydrogen, alkyl of 1 to 5 carbon atoms, aralkyl, —$NR^{63}R^{64}$ (wherein $R^{63}$ and $R^{64}$, which may be the same or different, are alkyl of 1 to 4 carbon atoms or 3- to 8-membered rings which may contain a hetero atom), or —$COR^{65}$ (wherein $R^{65}$ is alkyl of 1 to 4 carbon atoms or aryl of 6 to 14 carbon atoms). $R^{66}$ is hydrogen or alkyl of 1 to 4 carbon atoms. $R^{67}$, $R^{68}$ and $R^{69}$, which may be the same or different, are hydrogen or alkyl of 1 to 4 carbon atoms.

Examples of these crosslinkable substituents include glycidyl ether, glycidyl ester, glycidyl amino, methoxymethyl, ethoxymethyl, benzyloxymethyl, dimethylaminomethyl, diethoxymethylamino, morpholinomethyl, acetoxymethyl, benzoyloxymethyl, formyl, acetyl, vinyl, and isopropenyl.

The aromatic compounds having the above-mentioned substituents include, for example, bisphenol A epoxy compounds, bisphenol F epoxy compounds, bisphenol S epoxy compounds, novolak type epoxy compounds, resol resin type epoxy compounds, polyhydroxystyrene type epoxy compounds, methylol group-containing melamine resins, methylol group-containing benzoguanamine resins, methylol group-containing urea resins, methylol group-containing phenolic resins, methylol group-containing melamine compounds, methylol group-containing phenol compounds, alkyl ether group-containing melamine resins, alkyl ether group-containing benzoguanamine resins, alkyl ether group-containing urea resins, alkyl ether group-containing phenolic resins, alkyl ether group-containing melamine compounds, alkyl ether group-containing phenol compounds, carboxymethyl group-containing melamine resins, carboxymethyl group-containing benzoguanamine resins, carboxymethyl group-containing urea resins, carboxymethyl group-containing phenolic resins, carboxymethyl group-containing melamine compounds, and carboxymethyl group-containing phenol compounds. Of these, methylol group-containing phenolic resins, methylol group-containing phenol compounds, methoxymethyl group-containing melamine compounds, methoxymethyl group-containing phenol compounds, and acetoxymethyl group-containing phenol compounds are preferable.

Also useful as the compound crosslinkable under the action of acid (H) are alkali-soluble resins (G) which are modified with the crosslinkable substituents mentioned above so that the function of the compound crosslinkable under the action of acid is imparted. The proportion of the crosslinkable substituent introduced is usually 5 to 60% by weight, preferably 10 to 50% by weight, more preferably 15 to 40% by weight of the entire amount of acidic functional groups in the alkali-soluble resin (G). Less than 5% by weight of the crosslinkable substituent introduced would be difficult to induce sufficient crosslinking reaction, resulting in a lowering of film retention and winding and swelling of a pattern. More than 60% by weight of the crosslinkable substituent introduced would reduce the alkali solubility of the alkali-soluble resin (G), detracting from developability.

The amount of the compound crosslinkable under the action of acid blended is preferably 5 to 95 parts, more preferably 15 to 85 parts, and further preferably 20 to 75 parts by weight per 100 parts by weight of the alkali soluble resin (G). Less than 5 parts of the compound would be difficult to trigger crosslinking reaction and likely to invite a lowering of film retention and winding and swelling of a pattern. More than 95 parts of the compound tends to leave a more amount of scum, detracting from developability.

In the resist composition of the invention, a surfactant is optionally blended for facilitating coating. Examples of the surfactant include perfluoroalkylpoly-oxyethylene ethanols, fluorinated alkyl esters, perfluoroalkylamine oxides, and perfluoroalkyl EO addition products. Also, light-absorbing agents such as diaryl sulfoxides, diarylsulfones, 9,10-dimethylanthracene and 9-fluorenone may be added.

To form a pattern using the resist compositions of the invention, well-known positive or negative lithographic techniques may be employed. For example, the resist composition may be applied onto a silicon wafer by spin coating, and pre-baked at 80 to 150° C. for a period of 30 to 200 seconds, thereby forming a resist film having a thickness of 0.5 to 2.0 µm. The resist film may then be exposed to high-energy radiation, such as deep-UV, electron-beam or x-ray radiation, baked at 70 to 140° C. for a period of from 30 to 200 seconds (post-exposure baking=PEB), and then developed with an aqueous alkali solution. In this way, a desired resist pattern is formed on the substrate. The resist compositions are best suited for fine patterning with actinic radiation, especially deep-UV radiation having a wavelength of 254 to 193 nm, electron beam and x-ray.

EXAMPLE

Examples are given below to illustrate the invention, and are not intended to limit the scope thereof. In the examples, all parts are by weight.

Synthetic Example 1 tris(2-methoxymethoxyethyl)amine

To a suspension of 270.6 grams of potassium t-butoxide in 1,800 ml of tetrahydrofuran, 100.0 grams of triethanolamine in 200 ml of tetrahydrofuran was added dropwise over 10 minutes while stirring under ice cooling. After 40 minutes of stirring, 194.5 grams of chloromethyl methyl ether was added dropwise over 30 minutes while continuing stirring under ice cooling. After 30 minutes of stirring, 75.2 grams of potassium t-butoxide was added while continuing stirring under ice cooling. After 20 minutes of stirring, 54.0 grams of chloromethyl methyl ether was added dropwise over 10 minutes while continuing stirring under ice cooling. After 40 minutes of stirring, 500 ml of methanol was added. After 30 minutes of stirring, the reaction solution was filtered with a sufficient amount of Celite, and the residue was washed with ether. The filtrate was concentrated under vacuum, and the resulting oily matter was distilled under vacuum. On analysis by $^1$H-NMR, the thus collected oily matter was found to be tris(2-methoxymethoxyethyl)amine, designated Amine 1. Amount 139.9 grams, yield 74.2%.

Boiling point: 124–130° C./1–3 mmHg $^1$H-NMR (270 MHz, CDCl$_3$): d2.7985, 6H, t, 6.075 Hz; d3.322, 9H, s; d3.5865, 6H, t, 6.075 Hz; d4.585, 6H, s Synthetic Example 2 tris[2-(2-methoxyethoxy)methoxyethyl]amine

To a suspension of 135.3 grams of potassium t-butoxide in 900 ml of tetrahydrofuran, 50.0 grams of triethanolamine in 100 ml of tetrahydrofuran was added dropwise over 10 minutes while stirring under ice cooling. After 40 minutes of stirring, 150.4 grams of chloromethyl 2-methoxyethyl ether was added dropwise over 30 minutes while continuing stirring under ice cooling. After 30 minutes of stirring, 37.6 grams of potassium t-butoxide was added while continuing stirring under ice cooling. After 20 minutes of stirring, 41.8 grams of chloromethyl (2-methoxyethoxy)methyl ether was added dropwise over 10 minutes while continuing stirring under ice cooling. After 40 minutes of stirring, 250 ml of methanol was added. After 30 minutes of stirring, the reaction solution was filtered with a sufficient amount of Celite, and the residue was washed with ether. The filtrate was concentrated under vacuum, and the resulting oily matter was dissolved in 2,000 ml of methylene chloride. Using a separatory flask, the solution was washed three times with 200 ml of water. The organic phase was concentrated in vacuum. On analysis by $^1$H-NMR, the resulting oily matter was found to be tris[2-(2-methoxyethoxy)-methoxyethyl]amine, designated Amine 2. Amount 103.9 grams, yield 70.0%.

$^1$H-NMR (270 MHz, CDCl$_3$): d2.7715, 6H, t, 6.075 Hz; d3.345, 9H, s; d3.509, 6H, t, 4.95 Hz; d3.5905, 6H, t, 6.075 Hz; d3.641, 6H, t, 4.95 Hz; d4.663, 6H, s

Amine 1 and Amine 2 are novel compounds.

Examples and Comparative Examples

Resist compositions were prepared by dissolving amine compounds (designated Amine 1 to 14), base resins (designated below as Polym. 1 to 5), photoacid generators (designated as PAG. 1 to 4), a crosslinking agent (designated as Crosslinker 1), and dissolution inhibitors (designated as DRI. 1 and 2) in propylene glycol monomethyl ether acetate (PGMEA). These compositions were passed through a 0.2 μm Teflon filter, thereby giving resist solutions.

On silicon wafers, DUV-18L by Brewer Science was spin coated and baked at 200° C. for 120 seconds to form anti-reflecting films of 550 Å thick. On the anti-reflecting films, the resist solutions were spin coated, then baked at 100° C. for 90 seconds on a hot plate to give resist films having a thickness of 0.7 μm.

The resist films were exposed by means of an excimer laser stepper (NSR-2005EX8A, from Nikon Corporation; NA 0.5) while varying the exposure and focus. After exposure, the resist films were baked at 110° C. for 90 seconds and then developed for 60 seconds with a 2.38% aqueous solution of tetramethylammonium hydroxide, thereby giving positive patterns.

The resulting resist patterns were evaluated as described below. The results are shown in Tables 1 to 4.

Evaluation:

For an isolated line pattern of 0.18 μm lines and 0.90 μm spaces, a line width in the range of 0.16 to 0.20 μm was determined by means of a micrometer-equipped SEM S-7280 from Hitachi Ltd., and the cross-sectional profile was observed by means of a SEM S-4100 from Hitachi Ltd., from which the focus margin satisfying the requirement that the thinning of resist film was less than 10% was determined.

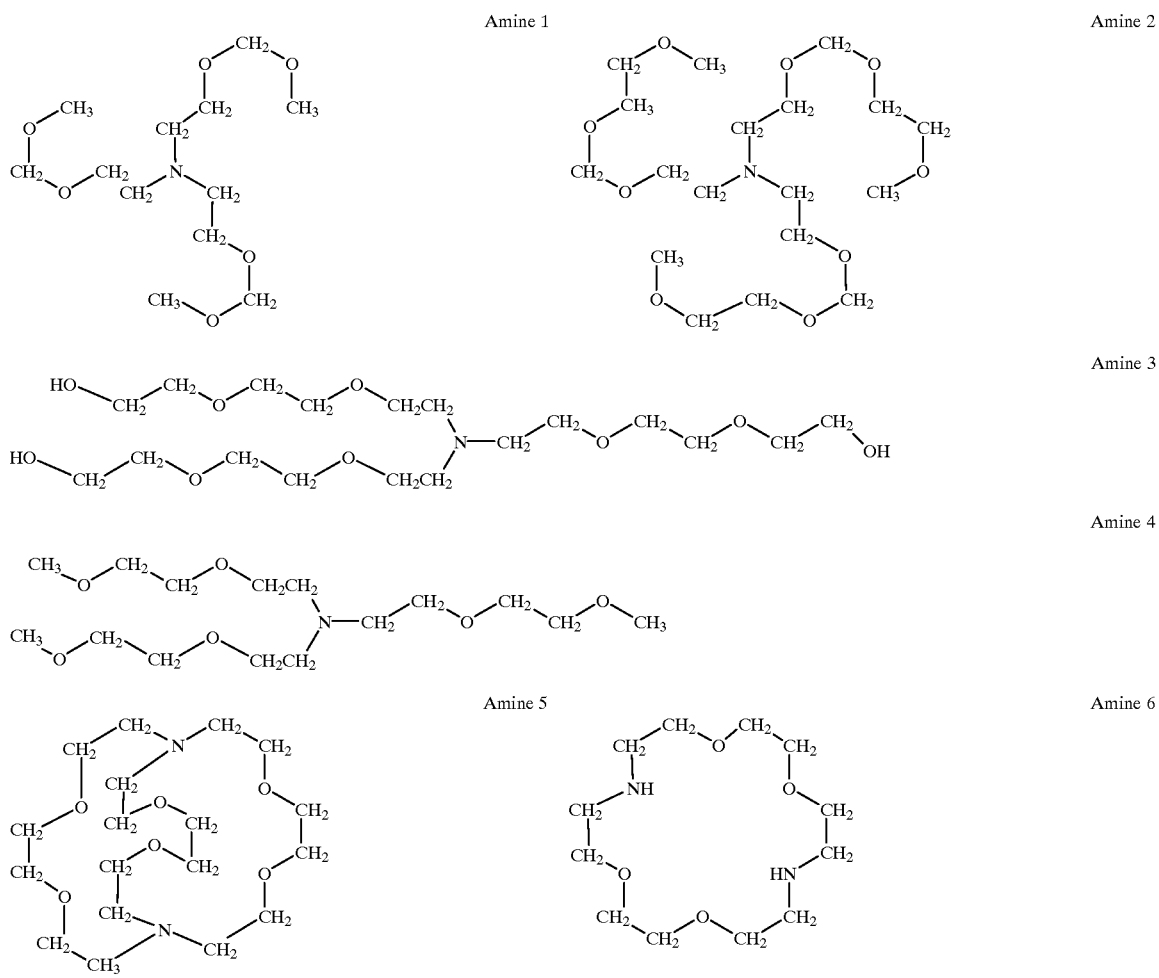

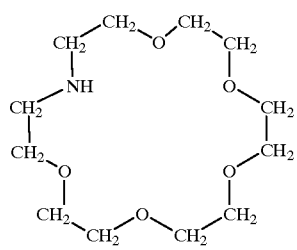
Amine 7
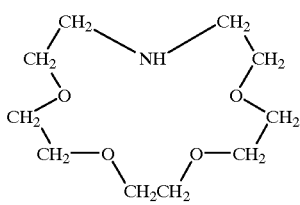
Amine 8
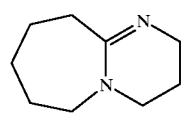
Amine 9
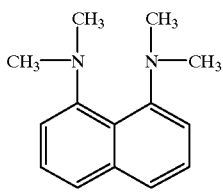
Amine 10
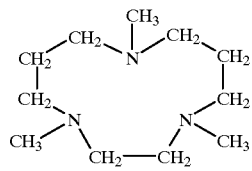
Amine 11
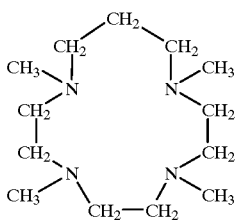
Amine 12
tetramethylammonium hydroxide Amine 13
N-methyl-2-pyrrolidone Amine 14
-continued
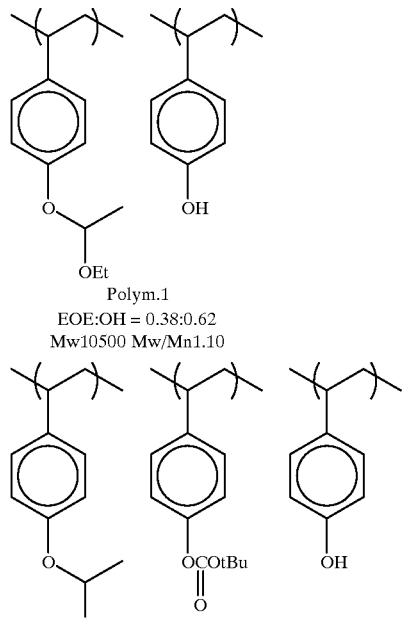
Polym.1
EOE:OH = 0.38:0.62
Mw10500 Mw/Mn1.10
Polym.2
EOE:t-Boc:OH = 0.27:0.08:0.65
Mw10500 Mw/Mn1.10
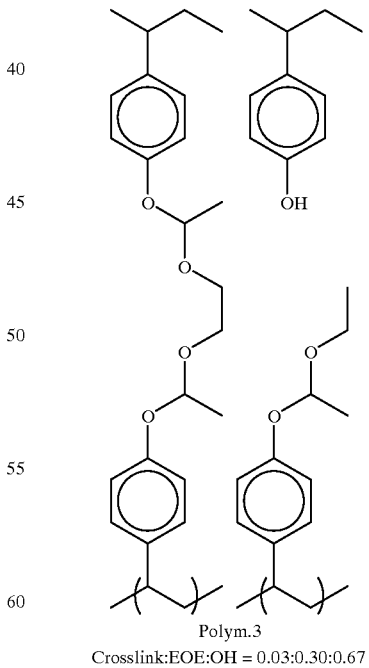
Polym.3
Crosslink:EOE:OH = 0.03:0.30:0.67
Mw25000 Mw/Mn3.20

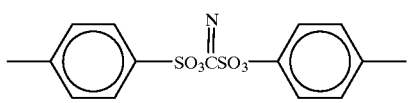
PAG.3
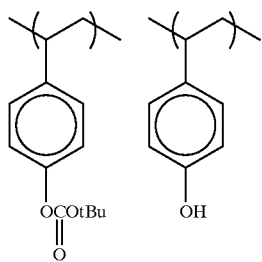
Polym.4
t-Boc:OH = 0.25:0.75
Mw10500 Mw/Mn1.10
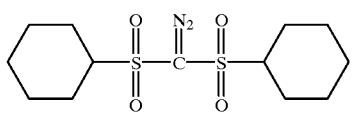
PAG.4
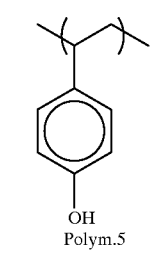
Polym.5
Mw10500 Mw/Mn1.10
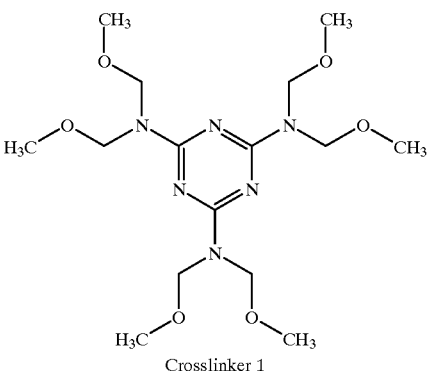
Crosslinker 1
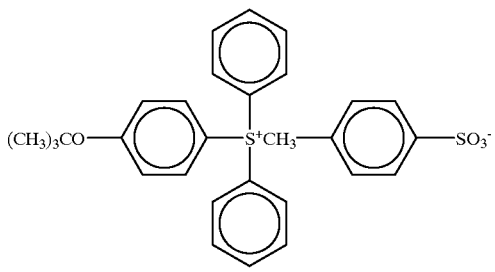
PAG.1
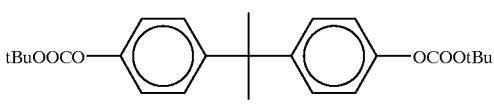
DRI.1
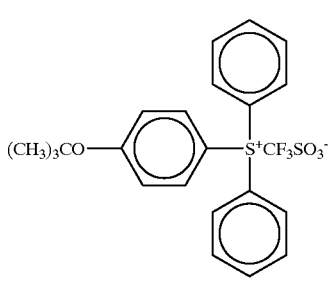
PAG.2
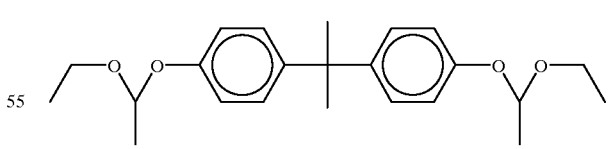
DRI.2

TABLE 1

| | Resist composition (compositional ratio in parentheses, unit: pbw) | | | | | | Focus margin ($\mu$m) |
|---|---|---|---|---|---|---|---|
| | Base resin | | Photoacid | Dissolution | Basic | | 0.18-$\mu$m |
| Example | Structure | Structure | generator | inhibitor | compound | Solvent | isolated line |
| 1 | Polym. 1 (60) | Polym. 4 (20) | PAG. 1 (2) | — | Amine 1 (0.3) | PGMEA (300) | 1.0 |
| 2 | Polym. 1 (60) | Polym. 4 (20) | PAG. 1 (2) | — | Amine 2 (0.3) | PGMEA (300) | 1.0 |
| 3 | Polym. 1 (60) | Polym. 4 (20) | PAG. 1 (2) | — | Amine 3 (0.3) | PGMEA (300) | 1.0 |
| 4 | Polym. 1 (60) | Polym. 4 (20) | PAG. 1 (2) | — | Amine 4 (0.3) | PGMEA (300) | 1.0 |
| 5 | Polym. 1 (60) | Polym. 4 (20) | PAG. 1 (2) | — | Amine 5 (0.2) | PGMEA (300) | 1.0 |
| 6 | Polym. 1 (60) | Polym. 4 (20) | PAG. 1 (2) | — | Amine 6 (0.2) | PGMEA (300) | 1.0 |
| 7 | Polym. 1 (60) | Polym. 4 (20) | PAG. 1 (2) | — | Amine 7 (0.4) | PGMEA (300) | 1.0 |
| 8 | Polym. 1 (60) | Polym. 4 (20) | PAG. 1 (2) | — | Amine 8 (0.4) | PGMEA (300) | 0.9 |
| 9 | Polym. 2 (80) | — | PAG. 1 (2) | — | Amine 4 (0.3) | PGMEA (300) | 0.9 |
| 10 | Polym. 3 (60) | Polym. 4 (20) | PAG. 1 (2) | — | Amine 4 (0.4) | PGMEA (300) | 1.1 |
| 11 | Polym. 1 (60) | Polym. 4 (20) | PAG. 2 (2) | — | Amine 1 (0.3) | PGMEA (300) | 0.9 |
| 12 | Polym. 1 (60) | Polym. 4 (20) | PAG. 3 (2) | — | Amine 1 (0.3) | PGMEA (300) | 0.9 |
| 13 | Polym. 1 (60) | Polym. 4 (20) | PAG. 1 (2) | DRI. 1 (16) | Amine 1 (0.3) | PGMEA (300) | 0.9 |
| 14 | Polym. 1 (60) | Polym. 4 (20) | PAG. 1 (2) | DRI. 2 (16) | Amine 1 (0.3) | PGMEA (300) | 0.9 |

PGMEA: propylene glycol monomethyl ether acetate
EL: ethyl lactate
MMP: methyl 3-methoxypropionate

TABLE 2

| | Resist composition (compositional ratio in parentheses, unit: pbw) | | | | | | Focus margin ($\mu$m) |
|---|---|---|---|---|---|---|---|
| | Base resin | | Photoacid | Crosslinking | Basic | | 0.18-$\mu$m |
| Example | Structure | Structure | generator | agent | compound | Solvent | isolated line |
| 15 | Polym. 2 (60) | Polym. 4 (20) | PAG. 2 (2) | — | Amine 4 (0.3) | MMP (300) | 1.0 |
| 16 | Polym. 2 (60) | Polym. 4 (20) | PAG. 2 (2) | — | Amine 4 (0.3) | PGMEA (210)/ EL (90) | 1.0 |
| 17 | Polym. 2 (60) | Polym. 4 (20) | PAG. 2 (2) | — | Amine 4 (0.3) | EL (300) | 1.0 |
| 18 | Polym. 3 (80) | — | PAG. 1 (2) | — | Amine 4 (0.3) | PGMEA (300) | 0.8 |
| 19 | Polym. 1 (60) | Polym. 4 (20) | PAG. 4 (2) | — | Amine 4 (0.3) | PGMEA (300) | 0.9 |
| 20 | Polym. 5 (80) | — | PAG. 1 (2) | Crosslinker 1 (15) | Amine 4 (0.3) | PGMEA (300) | 1.0 |

TABLE 3

| Comparative Example | Resist composition (compositional ratio in parentheses, unit: pbw) | | | | | | Focus margin ($\mu$m) 0.18-$\mu$m isolated line |
|---|---|---|---|---|---|---|---|
| | Base resin Structure | Structure | Photoacid generator | Dissolution inhibitor | Basic compound | Solvent | |
| 1 | Polym. 1 (60) | Polym. 4 (20) | PAG. 1 (2) | — | Amine 9 (0.2) | PGMEA (300) | 0.6 |
| 2 | Polym. 1 (60) | Polym. 4 (20) | PAG. 1 (2) | — | Amine 10 (0.15) | PGMEA (300) | 0.6 |
| 3 | Polym. 1 (60) | Polym. 4 (20) | PAG. 1 (2) | — | Amine 11 (0.15) | PGMEA (300) | 0.4 |
| 4 | Polym. 1 (60) | Polym. 4 (20) | PAG. 1 (2) | — | Amine 12 (0.15) | PGMEA (300) | 0.4 |
| 5 | Polym. 1 (60) | Polym. 4 (20) | PAG. 1 (2) | — | Amine 13 (0.2) | PGMEA (300) | 0.4 |
| 6 | Polym. 1 (60) | Polym. 4 (20) | PAG. 1 (2) | — | Amine 14 (0.3) | PGMEA (300) | 0 |
| 7 | Polym. 2 (80) | — | PAG. 1 (2) | — | Amine 11 (0.15) | PGMEA (300) | 0.4 |
| 8 | Polym. 3 (60) | Polym. 4 (20) | PAG. 1 (2) | — | Amine 11 (0.15) | PGMEA (300) | 0.5 |
| 9 | Polym. 1 (60) | Polym. 4 (20) | PAG. 2 (2) | — | Amine 11 (0.15) | PGMEA (300) | 0.4 |
| 10 | Polym. 1 (60) | Polym. 4 (20) | PAG. 3 (2) | — | Amine 11 (0.15) | PGMEA (300) | 0.4 |
| 11 | Polym. 1 (60) | Polym. 4 (20) | PAG. 1 (2) | DRI. 1 (16) | Amine 11 (0.15) | PGMEA (300) | 0.3 |
| 12 | Polym. 1 (60) | Polym. 4 (20) | PAG. 1 (2) | DRI. 2 (16) | Amine 11 (0.15) | PGMEA (300) | 0.3 |

TABLE 4

| Comparative Example | Resist composition (compositional ratio in parentheses, unit: pbw) | | | | | | Focus margin ($\mu$m) 0.18-$\mu$m isolated line |
|---|---|---|---|---|---|---|---|
| | Base resin Structure | Structure | Photoacid generator | Dissolution inhibitor or Crosslinking agent | Basic compound | Solvent | |
| 13 | Polym. 1 (60) | Polym. 4 (20) | PAG. 1 (2) | DRI. 2 (16) | Amine 12 (0.15) | MMP (300) | 0.4 |
| 14 | Polym. 1 (60) | Polym. 4 (20) | PAG. 1 (2) | DRI. 2 (16) | Amine 12 (0.15) | PGMEA (210)/ EL (90) | 0.4 |
| 15 | Polym. 1 (60) | Polym. 4 (20) | PAG. 1 (2) | DRI. 2 (16) | Amine 12 (0.15) | EL (300) | 0.4 |
| 16 | Polym. 3 (80) | — | PAG. 1 (2) | — | Amine 11 (0.15) | PGMEA (300) | 0.3 |
| 17 | Polym. 1 (60) | Polym. 4 (20) | PAG. 4 (2) | — | Amine 11 (0.15) | PGMEA (300) | 0.4 |
| 18 | Polym. 5 (80) | — | PAG. 1 (2) | Crosslinker 1 (15) | Amine 4 (0.3) | PGMEA (300) | 0.4 |

It is evident that the addition of basic compounds within the scope of the invention is effective for controlling the thinning of resist films and increasing the focus margin.

There have been described resist compositions comprising polyether group-bearing amines which are effective for preventing resist films from thinning and for increasing the focus margin of an isolated pattern.

Although some preferred embodiments have been described, many modifications and variations may be made thereto in the light of the above teachings. It is therfore to be understood that within the scope of the appended claims, the invention may be practiced otherwise than as specifically described.

What is claimed is:

1. A resist composition comprising (A) a basic compound of the following general formula (1) or (2):

(1)

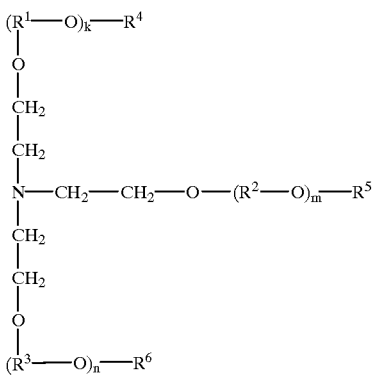

(2)

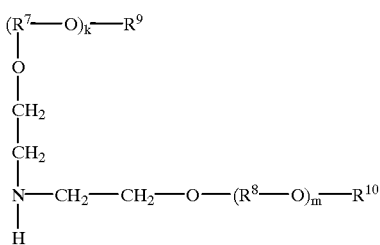

wherein
R$^1$, R$^2$, R$^3$, R$^7$, and R$^8$ are each independently normal, branched or cyclic alkylene groups having up to 20 carbon atoms,
R$^4$, R$^5$, R$^6$, R$^9$, and R$^{10}$ are each independently hydrogen, alkyl groups having 1 to 20 carbon atoms or amino groups, or R$^4$ and R$^5$, R$^5$ and R$^6$, R$^4$ and R$^6$, or R$^4$, R$^5$, and R$^6$, and R$^9$ and R$^{10}$, in each case taken together, may also independently form a ring, and
letters k, m and n are integers of 0 to 20,
with the proviso that hydrogen is excluded from R$^4$, R$^5$, R$^6$, R$^9$, and R$^{10}$ when k, m or n is equal to 0, (B) an organic solvent, (C) a base resin having an acidic functional group protected with an acid labile group, which is substantially alkali insoluble, but becomes alkali soluble when the acid labile group is eliminated, and (D) a photoacid generator.

2. A composition according to claim 1, wherein in the base resin (C), the acid labile group is at least one group selected from the group consisting of groups of the following general formula (3), groups of the following general formula (4), tertiary alkyl groups of 4 to 20 carbon atoms, trialkylsilyl groups whose alkyl groups each have 1 to 6 carbon atoms, and oxoalkyl groups of 4 to 20 carbon atoms, (3)

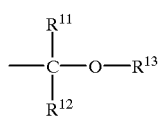

-continued (4)

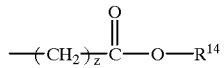

wherein
R$^{11}$ and R$^{12}$ are each independently hydrogen or normal, branched or cyclic alkyl groups having up to 18 carbon atoms,
R$^{13}$ is a monovalent hydrocarbon group having up to 18 carbon atoms which may have a hetero atom, or
R$^{11}$ and R$^{12}$, R R$^{11}$ and R$^{13}$, or R$^{12}$ and R$^{13}$, taken together, form a ring in which each of R$^{11}$, R$^{12}$, and R$^{13}$ is a normal or branched alkylene group of up to 18 carbon atoms,
R$^{14}$ is a tertiary alkyl group of up to 12 carbon atoms, a trialkylsilyl group whose alkyl groups each have up to 6 carbon atoms, an oxoalkyl group of 4 to 20 carbon atoms or a group of formula (3), and
letter z is an integer of 0 to 6.

3. A resist composition comprising
(A) a basic compound of the following general formula (1) or (2):

(1)

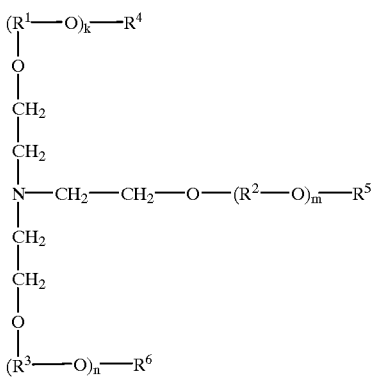

(2)

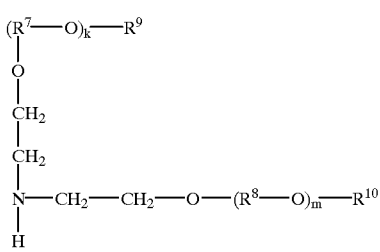

wherein
R$^1$, R$^2$, R$^3$, R$^7$, and R$^8$ are each independently normal, branched or cyclic alkylene groups having 1 to 20 carbon atoms,
R$^4$, R$^5$, R$^6$, R$^9$, and R$^{10}$ are each independently hydrogen, alkyl groups having 1 to 20 carbon atoms or amino groups, or R$^4$ and R$^5$, R$^5$ and R$^6$, R$^4$ and R$^6$, and R$^9$ and R$^{10}$, in each case taken together, may also independently form a ring, and
letters k, m and n are integers of 0 to 20,
with the proviso that hydrogen is excluded from R$^4$, R$^5$, R$^6$, R$^9$, and R$^{10}$ when k, m or n is equal to 0, (B) an organic solvent,
(C) a base resin having phenolic hydroxyl groups in which at least 10 mol % of the hydrogen atoms of the phenolic hydroxyl groups are substituted with acid labile groups of the following general formula (3):

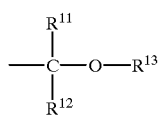

(3)

wherein
$R^{11}$ and $R^{12}$ are each independently hydrogen or normal, branched or cyclic alkyl groups having up to 18 carbon atoms,
$R^{13}$ is a monovalent hydrocarbon group of 1 to 18 carbon atoms, which may have a heteroatom, or
$R^{11}$ and $R^{12}$, $R^{11}$ and $R^{13}$, or $R^{12}$ and $R^{13}$ form a ring in which of each of $R^{11}$, $R^{12}$ and $R^{13}$ is independently a normal or branched alkylene group of 1 to 18 carbon atoms,
said base resin being crosslinked within a molecule and/or between molecules, in a proportion of more than 0 mol % of the hydrogen atoms of the remaining phenolic hydroxyl groups with crosslinking groups having C—O—C linkages represented by the following general formula (5a) or (5b):

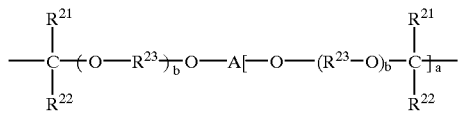

(5a)

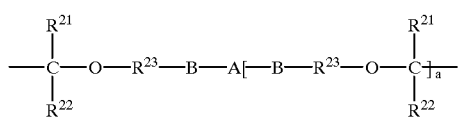

(5b)

wherein
$R^{21}$ $R^{22}$ are each independently hydrogen or a normal, branched or cyclic alkyl group having up to 8 carbon atoms, or
$R^{21}$ and $R^{22}$, taken together, may form a ring in which each of $R^{21}$ and $R^{22}$ is independently a normal or branched alkylene group of 1 to 8 carbon atoms,
$R^{23}$ is a normal, branched or cyclic alkylene group having up to 10 carbon atoms,
letter b is 0 or an integer of 1 to 10,
A is an a-valent aliphatic or alicyclic saturated hydrocarbon group, aromatic hydrocarbon group or heterocyclic group having up to 50 carbon atoms, which may have an intervening heteroatom and in which some of the hydrogen atoms attached to carbon atoms may be replaced by hydroxyl, carboxyl, carbonyl or fluorine,
B is —CO—O—, —NHCO—O— or —NHCONH—, letter a is an integer of 2 to 8, and
a' is an integer of 1 to 7,
said base resin having a weight average molecular weight of 5,000 to 100,000, and
(D) a photoacid generator.

4. A resist composition comprising:
(A) a basic compound of the following general formula (1) or (2):

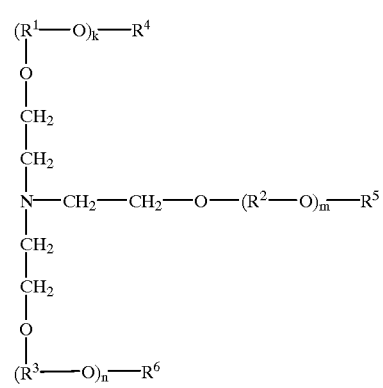

(1)

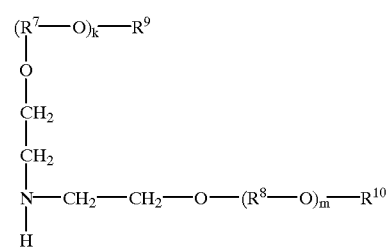

(2)

wherein
$R^1$, $R^2$, $R^3$, $R^8$ are each independently normal, branched or cyclic alkylene groups having up to 20 carbon atoms,
$R^4$, $R^5$, $R^6$, and $R^{10}$ are each independently hydrogen, alkyl group having 1 to 20
$R^4$, $R^5$, $R^6$, $R^9$, and $R^{10}$ are each independently hydrogen, alkyl groups having 1 to 20 carbon atoms or amino groups, or $R^4$ and $R^5$, $R^5$ and $R^6$, $R^4$ and $R^6$, or $R^4$, $R^5$, and $R^6$, and $R^9$ and $R^{10}$, in each case taken together, may also independently form a ring, and
letters k, m and n are integers of 0 to 20, with the proviso that hydrogen is excluded from $R^4$, $R^5$, $R^6$, $R^9$, and $R^{10}$ when k, m or n is equal to 0,
(B) an organic solvent,
(C) a base resin having an acidic functional group protected with an acid labile group, which is substantially alkali insoluble, but becomes alkali soluble when the acid labile group is eliminated,
(D) a photoacid generator, and
(E) a polymer having a weight average molecular weight of 3,000 to 300,000 and comprising recurring units of the following general formula (6):

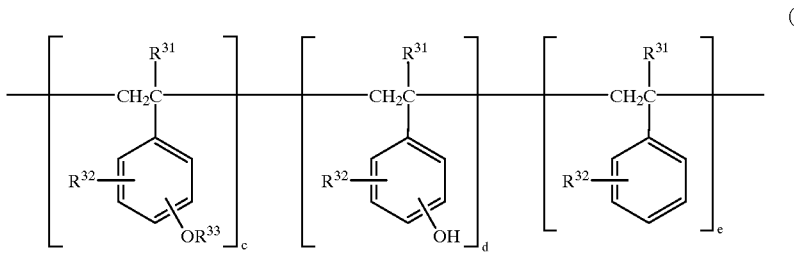

wherein
R³¹ is hydrogen or methyl,
R³² is a hydrogen or normal, branched or cyclic alkyl group having up to 8 carbon atoms,
R³³ is an acid labile group different from —CR¹¹R¹²OR¹³,
letters c and e are 0 or a positive number,
d is a positive number,
c+d+e=1, and
$0.5 \leq d/(c+d+e) \leq 1.0$.

5. A resist composition comprising
(A) a basic compound of the following general formula (1) or (2):

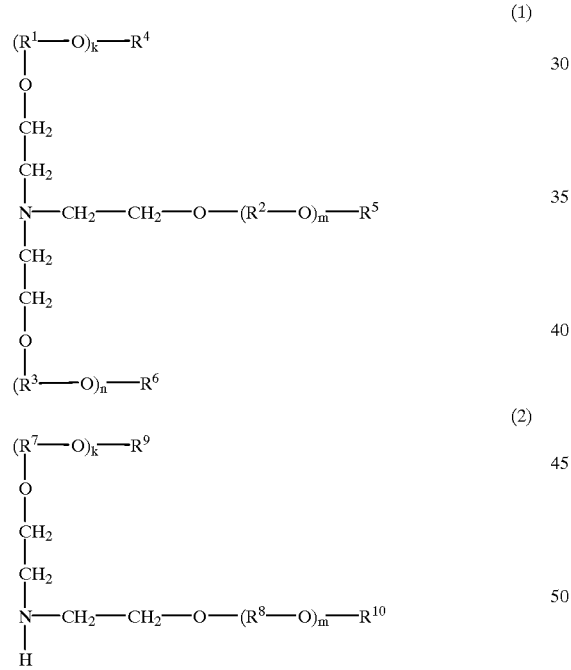

wherein
R¹, R², R³, R⁷, and R⁸ are each independently normal, branched or cyclic alkylene group having up to 20 carbon atoms,
R⁴, R⁵, R⁶, and R¹⁰ are each independently hydrogen, alkyl groups having 1 to 20 carbon atoms or amino groups, or R⁴ and R⁵, R⁵ and R⁶, R⁴ and R⁶, or R⁴, R⁵, and R⁶, and R⁹ and R¹⁰, in each case taken together, may also independently form a ring, and
letters k, m and n are integers of 0 to 20,
with the proviso that hydrogen is excluded form R⁴, R⁵, R⁶, R⁹, and R¹⁰ when k, m or n is equal to 0.
(B) an organic solvent, (C) a base resin having phenolic hydroxyl groups in which at least 10 mol % of the hydrogen atoms of the phenolic hydroxyl groups are substituted with acid labile groups of the following general formula (3):

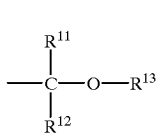

wherein
R¹¹ and R¹² are each independently hydrogen or normal, branched or cyclic alkyl groups having up to 18 carbon atoms,
R¹³ is a monovalent hydrocarbon group of 1 to 18 carbon atoms which may have a heteroatom, or
R¹¹ and R¹², R¹¹ and R¹³, or R¹² and R¹³ form a ring in which each of R¹¹, and R¹² and R¹³ is independently a normal or branched alkylene group of 1 or 18 carbon atoms,
said base resin being crosslinked within a molecule and/or between molecules, in a proportion of more than 0 mol % of the hydrogen atoms of the remaining phenolic hydroxyl groups, with crosslinking groups having C—O—C linkages represented by the following general formula (5a) or (5b):

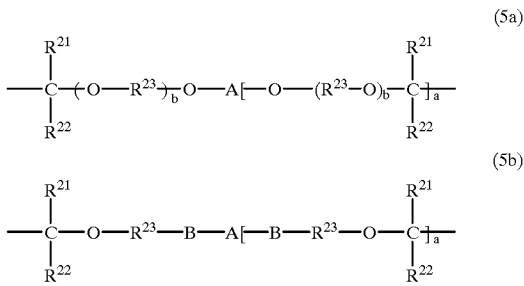

wherein
R²¹ and R²² are each independently hydrogen or a normal, branched or cyclic alkyl group having up to 8 carbon atoms, or
R²¹ and R²², taken together, form a ring in which each of R²¹ and R²² is independently a normal or branched alkylene group of 1 to 8 carbon atoms when they form a ring,
R²³ is a normal, branched or cyclic alkylene group having up to 10 carbon atoms,
letter b is 0 or an integer of 1 to 10,
A is an a-valent aliphatic or alicyclic saturated hydrocarbon group, aromatic hydrocarbon group or heterocyclic group having up to 50 carbon atoms, which may have an intervening heteroatom and in which some of the hydrogen atoms attached to carbon atoms may be replaced by hydroxyl, carboxyl, carbonyl or fluorine, B is —CO—O—, —NHCO—O— or —NHCONH—, letter a is an integer of 2 to 8, and a' is an integer of 1 to 7, said base resin having a weight average molecular weight of 5,000 to 100,000, and (D) a photoacid generator, and (E) a polymer having a weight average molecular weight of 3,000 to 300,000 and comprising recurring units of the following general formula (6):

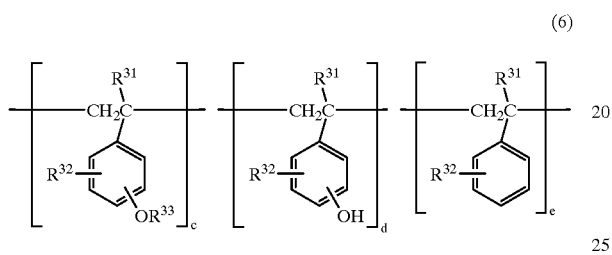

(6)

wherein $R^{31}$ is hydrogen or methyl, $R^{32}$ is a hydrogen or normal, branched or cyclic alkyl group having up to 8 carbon atoms, $R^{33}$ is an acid labile group different from —$CR^{11}R^{12}OR^{13}$, letters c and e are 0 or a positive number, d is a positive number, c+d+e=1, and $0.5 \leq d/(c+d+e) \leq 1.0$.

6. A resist composition according to claim 4, wherein in the base resin (C), the acid labile group is at least one group selected from the group consisting of groups of the following general formula (3), groups of the following general formula (4), tertiary alkyl groups of 4 to 20 carbon atoms, trialkylsilyl groups whose alkyl groups each have 1 to 6 carbon atoms, and oxoalkyl groups of 4 to 20 carbon atoms,

(3)

(4)

wherein $R^{11}$ and $R^{12}$ are each independently hydrogen or normal, branched or cyclic alkyl groups having up to 18 carbon atoms, $R^{13}$ is a monovalent hydrocarbon group having up to 18 carbon atoms which may have a hetero atom, or $R^{11}$ and $R^{12}$, R $R^{11}$ and $R^{13}$, or $R^{12}$ and $R^{13}$, taken together, form a ring in which each of $R^{11}$, $R^{12}$, and $R^{13}$ is a normal or branched alkylene group of up to 18 carbon atoms, $R^{14}$ is a tertiary alkyl group of up to 12 carbon atoms, a trialkylsilyl group whose alkyl groups each have up to 6 carbon atoms, an oxoalkyl group of 4 to 20 carbon atoms or a group of formula (3), and letter z is an integer of 0 to 6.

7. A resist composition of claim 3, further comprising (F) a dissolution inhibitor having an acid labile group.

8. A resist composition of claim 4, further comprising (F) a dissolution inhibitor having an acid labile group.

9. A resist composition of claim 5, further comprising (F) a dissolution inhibitor having an acid labile group.

10. A resist composition comprising (A) a basic compound of the following general formula (1) or (2):

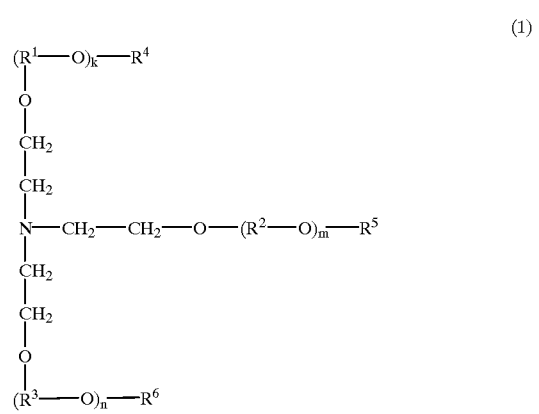

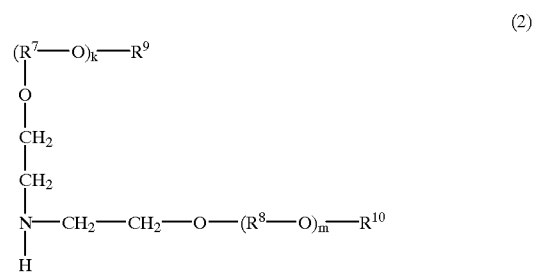

wherein $R^1$, $R^2$, $R^3$, $R^7$, and $R^8$ are each independently normal, branched or cyclic alkylene groups having up to 20 carbon atoms, $R^4$, $R^5$, $R^6$, $R^9$, and $R^{10}$ are each independently hydrogen, allyl groups having 1 to 20 carbon atoms or amino groups, or $R^4$ and $R^5$, $R^5$ and $R^6$, $R^4$ and $R^6$, or $R^4$, $R^5$, and $R^6$, and $R^9$ and $R^{10}$, in each case taken together, may also independently form a ring, letters k, m and n are integers of 0 to 20, with the proviso that hydrogen is excluded from $R^4$, $R^5$, $R^6$, $R^9$, and $R^{10}$ when k, m or n is equal to 0

(B) an organic solvent, (G) an alkali soluble resin, (D) a photoacid generator, and (H) a compound crosslinkable under the action of an acid.

11. A resist composition comprising (A) a basis compound of the following general formula (2):

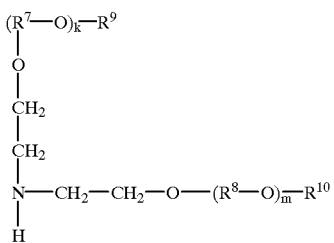

(2)

wherein $R^1, R^2, R^3, R^7$, and $R^8$ are each independently normal, branched or cyclic alkylene groups having up to 20 carbon atoms, $R^4, R^5, R^6, R^9$, and $R^{10}$ are each independently hydrogen, alkyl groups having 1 to 20 carbon atoms or amino groups, or $R^4$ and $R^5$, $R^5$ and $R^6$, $R^4$ and $R^6$, or $R^4$, $R^5$, and $R^6$, and $R^9$ and $R^{10}$, in each case taken together, may also independently form a ring, and letters k, m and n are integers of 0 to 20, with the proviso that hydrogen is excluded from $R^4, R^5, R^6, R^9$, and $R^{10}$ when k, m or n is equal to 0, (B) an organic solvent,
(C) a base resin, and
(D) a photoacid generator.

12. A resist composition according to claim 1, wherein the amount of component (A) is 0.001–10 parts by weight per 100 parts by weight of base resin (C), the amount of component B is 100–5,000 parts by weight per 100 parts by weight of base resin (C), and the amount of component (D) is 0.2–20 parts by weight per 100 parts by weight of base resin (C).

13. A resist composition according to claim 1, further comprising a base resin (E) containing a polymer having recurring units of formula (6) and having a weight average molecular weight of 3,000 to 30,000:

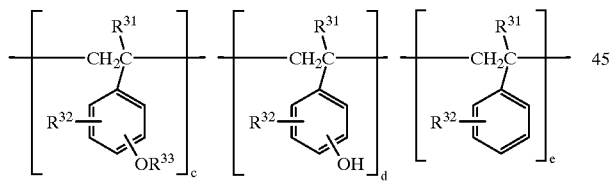

(6)

wherein $R^{31}$ is hydrogen or methyl, $R^{32}$ is a hydrogen or normal, branched or cyclic alkyl group having up to 8 carbon atoms, $R^{33}$ is an acid labile group different from $—CR^{11}R^{12}OR^{13}$, letters c and e are 0 or a positive number, d is a positive number, c+d+e=1, and $0.5 \leq d/(c+d+e) \leq 1.0$.

14. A resist composition according to claim 13, wherein the amount of component (A) is 0.001–10 parts by weight per 100 parts by weight of combined base resins (C) and (E), the amount of component B is 100–5,000 parts by weight per 100 parts by weight of combined base resins (C) and (E), and the amount of component (D) is 0.2–20 parts by weight per 100 parts by weight of combined base resins (C) and (E).

15. A resist composition according to claim 14, wherein the weight ratio of base resin (E) to base resin (C) is up to 90:10.

16. A resist composition according to claim 1, wherein component (D) is an onium salt of formula (7), a diazomethane of formula (8), or a glyoxime of formula (9):

(7)

wherein $R^{40}$ is a normal, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, and the letter r is equal to 2 or 3;

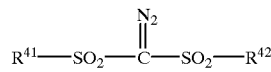

(8)

wherein $R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

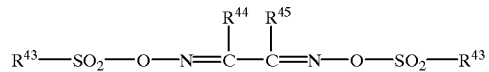

(9)

wherein $R^{43}, R^{44}$ and $R^{45}$ are each independently a normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms, or $R^{44}$ and $R^{45}$ together can also form a cyclic structure in which each is a normal or branched alkylene group of 1 to 6 carbon atoms.

17. A resist composition according to claim 1, wherein component (D) is 2-cyclohexylcarbonyl-2-(p-toluenesulfonyl)propane, 2-isopropylcarbonyl-2-(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxyimidoyl triflate, 5-norbornene-2,3-dicarboxyimidoyl tosylate, or 5-norbornene-2,3-dicarboxyimidoyl n-butylsulfonate.

18. A resist composition according to claim 1, wherein $R^1, R^2, R^3, R^7$, and $R^8$ are each independently methylene, ethylene, n-propylene, isopropylene, n-butylene, isobutylene, n-pentylene, isopentylene, hexylene, nonylene, decylene, cyclopentylene, or cyclohexylene;

$R^4, R^5, R^6, R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or $R^4$ and $R^5$, $R^5$ and $R^6$, $R^4$ and $R^6$, or $R^4$, $R^5$, and $R^6$, and $R^9$ and $R^{10}$, in each case taken together, form a ring in which $R^4$, $R^5$, $R^6$, $R^9$ and $R^{10}$ are each an alkylene group having 1 to 6 carbon atoms, in which the ring optionally has a branched alkyl group of 1 to 6 carbon atoms, and letters k, m and n are integers of 1 to 10.

19. A resist composition according to claim 2, wherein the amount of component (A) is 0.001–10 parts by weight per 100 parts by weight of base resin (C), the amount of component B is 100–5,000 parts by weight per 100 parts by weight of base resin (C), and the amount of component (D) is 0.2–20 parts by weight per 100 parts by weight of base resin (C).

20. A resist composition according to claim 2, further comprising a base resin (E) containing a polymer having recurring units of formula (6) and having a weight average molecular weight of 3,000 to 30,000:

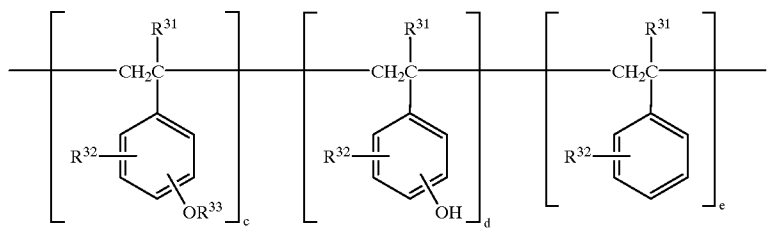

(6)

wherein $R^{31}$ is hydrogen or methyl, $R^{32}$ is a hydrogen or normal, branched or cyclic alkyl group having up to 8 carbon atoms, $R^{33}$ is an acid labile group different from $-CR^{11}R^{12}OR^{13}$, letters c and e are 0 or a positive number, d is a positive number, c+d+e=1, and $0.5 \leq d/(c+d+e) \leq 1.0$.

21. A resist composition according to claim 20, wherein the amount of component (A) is 0.001–10 parts by weight per 100 parts by weight of combined base resins (C) and (E), the amount of component B is 100–5,000 parts by weight per 100 parts by weight of combined base resins (C) and (E), and the amount of component (D) is 0.2–20 parts by weight per 100 parts by weight of combined base resins (C) and (E).

22. A resist composition according to claim 2, wherein the weight ratio of base resin (E) to base resin (C) is up to 90:10.

23. A resist composition according to claim 2, wherein component (D) is an onium salt of formula (7), a diazomethane of formula (8), or a glyoxime of formula (9):

$$(R^{40})_rM^+K^- \qquad (7)$$

wherein $R^{40}$ is a normal, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, and the letter r is equal to 2 or 3;

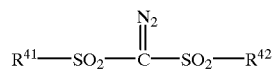

(8)

wherein $R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

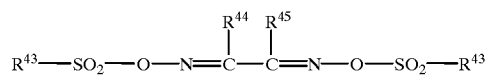

(9)

wherein $R^{43}$, $R^{44}$ and $R^{45}$ are each independently a normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms, or $R^{44}$ and $R^{45}$ together can also form a cyclic structure in which each is a normal or branched alkylene group of 1 to 6 carbon atoms.

24. A resist composition according to claim 2, wherein component (D) is 2-cyclohexylcarbonyl-2-(p-toluenesulfonyl)propane, 2-isopropylcarbonyl-2(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxytriflate, 5-norbornene-2,3-dicarboxyimidoyl triflate, 5-norbornene-2,3-dicarboxyimidoyl tosylate, or 5-norbornene-2,3-dicarboxyimidoyl n-butylsulfonate.

25. A resist composition according to claim 2, wherein $R^1, R^2, R^3, R^7$, and $R^8$ are each independently methylene, ethylene, n-propylene, isopropylene, n-butylene, isobutylene, n-pentylene, isopentylene, hexylene, nonylene, decylene, cyclopentylene, or cyclohexylene;

$R^4, R^5, R^6, R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or $R^4$ and $R^5$, $R^5$ and $R^6$, $R^4$ and $R^6$, or $R^4$, $R^5$, and $R^6$, and $R^9$ and and $R^{10}$, in each case taken together, form a ring in which $R^4$, $R^5$, $R^6$, $R^9$ and $R^{10}$ are each an alkylene group having 1 to 6 carbon atoms, in which the ring optionally has a branched alkyl group of 1 to 6 carbon atoms, and letters k, m and n are integers of 1 to 10.

26. A resist composition according to claim 2, wherein the acid labile group is:

a group of formula (3) in which $R^{11}$ and $R^{12}$ are each independently methyl, ethyl, n-propyl, isopropyl, n-butyl, isobutyl, tert-butyl, n-pentyl, isopentyl, hexyl, nonyl, decyl, cyclopentyl, or cyclohexyl, and $R^{13}$ is a normal, branched or cyclied alkyl group of 1 to 18 carbon atoms, phenyl, p-methylphenyl, p-ethylphenyl, p-methoxyphenyl, benzyl or phenethyl;

a group of formula (4) in which $R^{14}$ is tert-butyl, 1-methylcyclohexyl, 2-(2-methyl)adamantyl or tert-amyl;

a tertiary alkyl group selected from tert-butyl, 1-methylcyclohexyl, 2-(2-methyl)adamantyl and tert-amyl;

a trialkyl silyl group selected from trimethylsilyl, triethylsilyl and dimethyl-tert-butyl; or a oxoalkyl group selected from 3-oxocyclohexyl,

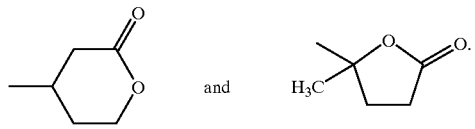

27. A resist composition according to claim 3, wherein the amount of component (A) is 0.001–10 parts by weight per 100 parts by weight of base resin (C), the amount of component B is 100–5,000 parts by weight per 100 parts by weight of base resin (C), and the amount of component (D) is 0.2–20 parts by weight per 100 parts by weight of base resin (C).

28. A resist composition according to claim 3, further comprising a base resin (E) containing a polymer having recurring units of formula (6) and having a weight average molecular weight of 3,000 to 30,000:

letters c and e are 0 or a positive number, d is a positive number, c+d+e=1, and $0.5 \leq d/(c+d+e) \leq 1.0$.

29. A resist composition according to claim 28, wherein the amount of component (A) is 0.001–10 parts by weight per 100 parts by weight of combined base resins (C) and (E), the amount of component B is 100–5,000 parts by weight per 100 parts by weight of combined base resins (C) and (E), and the amount of component (D) is 0.2–20 parts by weight per 100 parts by weight of combined base resins (C) and (E).

30. A resist composition according to claim 3, wherein the weight ratio of base resin (E) to base resin (C) is up to 90:10.

31. A resist composition according to claim 3, wherein component (D) is an onion salt of formula (7), a diazomethane of formula (8), or a glyoxime of formula (9):

wherein $R^{40}$ is a normal, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, and the letter r is equal to 2 or 3;

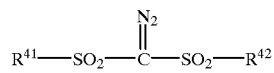

wherein $R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

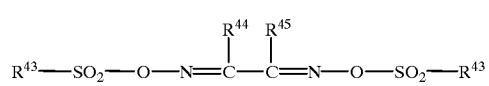

wherein $R^{43}$, $R^{44}$ and $R^{45}$ are each independently a normal, branched or cyclic alkyl or halogenated alkyl

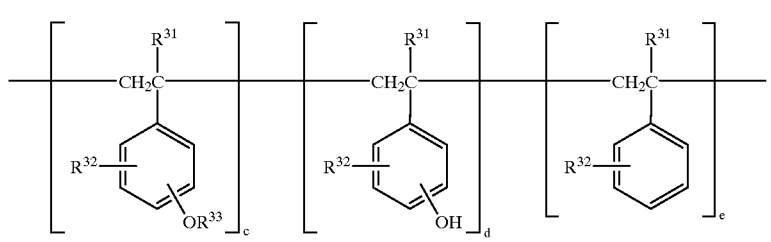

wherein $R^{31}$ is hydrogen or methyl, $R^{32}$ is a hydrogen or normal, branched or cyclic alkyl group having up to 8 carbon atoms, $R^{33}$ is an acid labile group different from $-CR^{11}R^{12}OR^{13}$, groups of 1 to 12 carbon atoms, aryl or halogenated aryl groups of 6 to 12 carbon atoms, or aralkyl groups of 7 to 12 carbon atoms, or $R^{44}$ and $R^{45}$ together can also form a cyclic structure in which each is a normal or branched alkylene group of 1 to 6 carbon atoms.

32. A resist composition according to claim 3, wherein component (D) is 2-cyclohexylcarbonyl-2-(p-toluenesulfonyl)propane, 2-isopropylcarbonyl-2-(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxyimidoyl triflate, 5-norbornene-2,3-dicarboxyimidoyl tosylate, or 5-norbornene-2,3-dicarboxyimidoyl n-butylsulfonate.

33. A resist composition according to claim 3, wherein
$R^1, R^2, R^3, R^7, R^8$ and are each independently methylene, ethylene, n-propylene, isopropylene, n-butylene, isobutylene, n-pentylene, isopentylene, hexylene, nonylene, decylene, cyclopentylene, or cyclohexylene;

$R^4, R^5, R^6, R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or $R^4$ and $R^5$, $R^5$ and $R^6$, $R^4$ and $R^6$, or $R^4, R^5$, and $R^6$, and $R^9$ and $R^{10}$, in each case taken together, form a ring in which $R^4, R^5, R^6, R^9$ and $R^{10}$ are each an alkylene group having 1 to 6 carbon atoms, in which the ring optionally has a branched alkyl group of 1 to 6 carbon atoms, and letters k, m and n are integers of 1 to 10.

34. A resist composition according to claim 4, wherein the amount of component (A) is 0.001–10 parts by weight per 100 parts by weight of combined base resins (C) and (E), the amount of component B is 100–5,000 parts by weight per 100 parts by weight of combined base resins (C) and (E), and the amount of component (D) is 0.2–20 parts by weight per 100 parts by weight of combined base resins (C) and (E).

35. A resist composition according to claim 4, wherein the weight ratio of base resin (E) to base resin (C) is up to 90:10.

36. A resist composition according to claim 4, wherein component (D) is an onion salt of formula (7), a diazomethane of formula (8), or a glyoxime of formula (9):

$$(R^{40})_rM^+K^- \qquad (7)$$

wherein
$R^{40}$ is a normal, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, and the letter r is equal to 2 or 3;

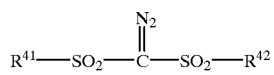

(8)

wherein
$R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

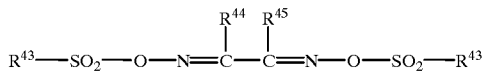

(9)

wherein
$R^{43}, R^{44}$ and $R^{45}$ are each independently a normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms, or $R^{44}$ and $R^{45}$ together can also form a cyclic structure in which each is a normal or branched alkylene group of 1 to 6 carbon atoms.

37. A resist composition according to claim 4, wherein component (D) is 2-cyclohexylcarbonyl-2-(p-toluenesulfonyl)propane, 2-isopropylcarbonyl-2-(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxyimidoyl triflate, 5-norbornene-2,3-dicarboxyimidoyl tosylate, or 5-norbornene-2,3-dicarboxyimidpoyl n-butylsulfonate.

38. A resist composition according to claim 4, wherein
$R^1, R^2, R^3, R^7$, and $R^8$ are each independently methylene, ethylene, n-propylene, isopropylene, n-butylene, isobutylene, n-pentylene, isopentylene, hexylene, nonylene, decylene, cyclopentylene, or cyclohexylene;

$R^4, R^5, R^6, R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or $R^4$ and $R^5$, $R^5$ and $R^6$, $R^4$ and $R^6$, or $R^4, R^5$, and $R^6$, and $R^9$ and $R^{10}$, in each case taken together, form a ring in which $R^4, R^5$, and $R^6, R^9$ and $R^{10}$ are each an alkylene group having 1 to 6 carbon atoms, in which the ring optionally has a branched alkyl group of 1 to 6 carbon atoms, and letters k, m and n are integers of 1 to 10.

39. A resist composition according to claim 5, wherein the amount of component (A) is 0.001–10 parts by weight per 100 parts by weight of combined base resins (C) and (E), the amount of component B is 100–5,000 parts by weight per 100 parts by weight of combined base resins (C) and (E), and the amount of component (D) is 0.2–20 parts by weight per 100 parts by weight of combined base resins (C) and (E).

40. A resist composition according to claim 5, wherein the weight ratio of base resin (E) to base resin (C) is up to 90:10.

41. A resist composition according to claim 5, wherein component (D) is an onion salt of formula (7), a diazomethane of formula (8), or a glyoxime of formula (9):

$$(R^{40})_rM^+K^- \qquad (7)$$

wherein
$R^{40}$ is a normal, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, and the letter r is equal to 2 or 3;

(8)

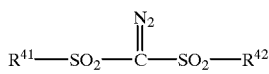

wherein
$R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

(9)

wherein
$R^{43}$, $R^{44}$ and $R^{45}$ are each independently a normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms, or
$R^{44}$ and $R^{45}$ together can also form a cyclic structure in which each is a normal or branched alkylene group of 1 to 6 carbon atoms.

42. A resist composition according to claim 5, wherein component (D) is 2-cyclohexylcarbonyl-2-(p-toluenesulfonyl)propane, 2-isopropylcarbonyl-2-(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxyimidoyl triflate, 5-norbornene-2,3-dicarboxyimidoyl tosylate, or 5-norbornene-2,3-dicarboxyimidoyl n-butylsulfonate.

43. A resist composition according to claim 5, wherein
$R^1$, $R^2$, $R^3$, $R^7$, and $R^8$ are each independently methylene, ethylene, n-propylene, isopropylene, n-butylene, isobutylene, n-pentylene, isopentylene, hexylene, nonylene, decylene, cyclopentylene, or cyclohexylene;
$R^4$, $R^5$, $R^6$, $R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or
$R^4$ and $R^5$, $R^5$ and $R^6$, $R^4$ and $R^6$, or $R^4$, $R^5$, and $R^6$, and $R^9$ and $R^{10}$, in each case taken together, form a ring in which $R^4$, $R^5$, $R^6$, $R^9$ and $R^{10}$ are each an alkylene group having 1 to 6 carbon atoms, in which the ring optionally has a branched alkyl group of 1 to 6 carbon atoms, and
letters k, m and n are integers of 1 to 10.

44. A resist composition according to claim 7, wherein component (F) is a bisphenol derivative in which hydroxy groups are replaced by tert-butoxy, tert-butoxycarbonyloxy or ethoxyethyl groups.

45. A resist composition according to claim 8, wherein component (F) is a bisphenol derivative in which hydroxy groups are replaced by tert-butoxy, tert-butoxycarbonyloxy or ethoxyethyl groups.

46. A resist composition according to claim 9, wherein component (F) is a bisphenol derivative in which hydroxy groups are replaced by tert-butoxy, tert-butoxycarbonyloxy or ethoxyethyl groups.

47. A resist composition according to claim 10, wherein component (D) is an onion salt of formula (7), a diazomethane of formula (8), or a glyoxime of formula (9):

$$(R^{40})_rM^+K^- \qquad (7)$$

wherein
$R^{40}$ is a normal, branched or cyclic alkyl group of 1 to 12 carbon atoms, an aryl group of 6 to 12 carbon atoms, or an aralkyl group of 7 to 12 carbon atoms,
$M^+$ is iodonium or sulfonium,
$K^-$ is a non-nucleophilic counter-ion, and
the letter r is equal to 2 or 3;

(8)

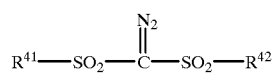

wherein
$R^{41}$ and $R^{42}$ are each independently a normal, branched or cyclic alkyl or halogenated alkyl groups of 1 to 12 carbon atoms, aryl or halogenated aryl groups of 6 to 12 carbon, or aralkyl groups of 7 to 12 carbon;

(9)

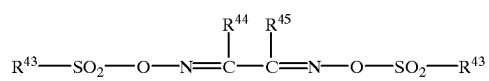

wherein
$R^{43}$, $R^{44}$ and $R^{45}$ are each independently a normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms, or
$R^{44}$ and $R^{45}$ together can also form a cyclic structure in which each is a normal or branched alkylene group of 1 to 6 carbon atoms.

48. A resist composition according to claim 10, wherein component (D) is 2-cyclohexylcarbonyl-2-(p-toluenesulfonyl)propane, 2-isopropylcarbonyl-2-(p-toluenesulfonyl)propane, diphenyl disulfone, dicyclohexyl disulfone, 2,6-dinitrobenzyl p-toluenesulfonate, 2,4-dinitrobenzyl p-toluenesulfonate, 1,2,3-tris(methanesulfonyloxy)benzene, 1,2,3-tris(trifluoromethanesulfonyloxy)benzene, 1,2,3-tris(p-toluenesulfonyloxy)benzene, and phthalimidoyl triflate, phthalimidoyl tosylate, 5-norbornene-2,3-dicarboxyimidoyl triflate, 5-norbornene-2,3-dicarboxyimidoyl tosylate, or 5-norbornene-2,3-dicarboxyimidoyl n-butylsulfonate.

49. A resist composition according to claim 10, wherein
$R^1$, $R^2$, $R^3$, $R^7$, and $R^8$ are each independently methylene, ethylene, n-propylene, isopropylene, n-butylene, isobutylene, n-pentylene, isopentylene, hexylene, nonylene, decylene, cyclopentylene, or cyclohexylene;
$R^4$, $R^5$, $R^6$, $R^9$, and $R^{10}$ are each independently methyl, ethyl, n-propyl, isopropyl, n-butyl, isobutyl, tert-butyl, n-pentyl, isopentyl, hexyl, nonyl, decyl, dodecyl, tridecyl, cyclopentyl, or cyclohexyl; or
$R^4$ and $R^5$, $R^5$ and $R^6$, $R^4$ and $R^6$, or $R^4$, $R^5$, and $R^6$, and $R^9$ and $R^{10}$, in each case taken together, form a ring in which $R^4$, $R^5$, $R^6$, $R^9$ and $R^{10}$ are each an alkylene group having 1 to 6 carbon atoms, in which the ring optionally has a branched alkyl group of 1 to 6 carbon atoms, and letters k, m and n are integers of 1 to 10.

50. A resist composition according to claim 10, wherein component (G) is an alkali soluble resin containing at least one polymer of formulas (10), (11) and (12) in which the hydrogen atoms of hydroxyl groups, carboxyl groups or both, are partially replaced by acid labile groups in an average proportion of more than 0 mol % to 80 mol % and the weight average molecular weight is 3,000 to 30,000:

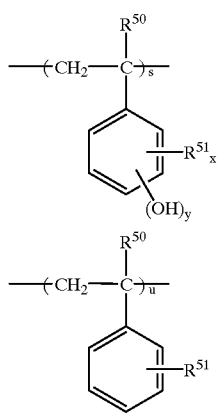
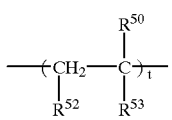
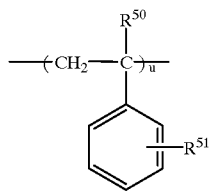

(10)

wherein $R^{50}$ is hydrogen or methyl, $R^{51}$ is a hydrogen or a normal, branched or cyclic alkyl group of 1 to 8 carbon atoms, $R^{52}$ is hydrogen or cyano, $R^{53}$ is hydrogen, cyano or —COOY wherein Y is hydrogen or normal, branched or cyclic alkyl of 1 to 6 carbon atoms, or $R^{52}$ and $R^{53}$, taken together, form —CO—O—CO— or —CO—NR$^0$—CO— wherein $R^0$ is a normal, branched or cyclic alkyl group of 1 to 8 carbon atoms or aryl of 6 to 10 carbon atoms, letter x is 0 or a positive integer, letter y is a positive integer, satisfying x+y≦5, letters s, t and u, representative of molar fractions, are each 0 or positive numbers, satisfying s+t+u+u=1, wherein both s and t are not equal to 0 at the same time;

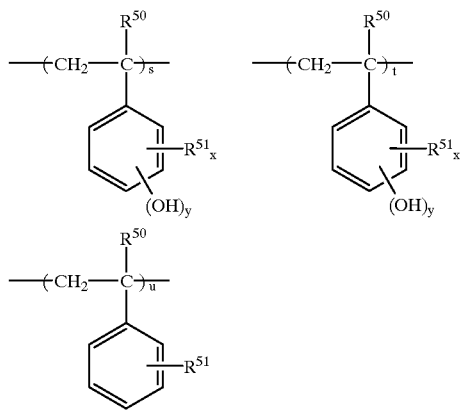

(11)

wherein $R^{50}$, $R^{51}$, x and y are as defined above, and letters s, t and u are representative of molar fractions wherein s and t are positive numbers, and u is 0 or a positive number, satisfying s+t+u=1;

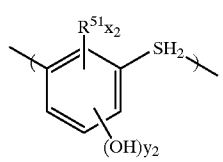

(12)

wherein $R^{51}$ is as defined above, letter $x_2$ is 0 or a positive integer, and $y_2$ is a positive integer, satisfying $x_2+y_2 \leq 4$.

51. A resist composition according to claim 10, wherein component (H) is an aromatic compound having a —C($R^{60}R^{61}$)—OR$^{62}$, a group —CO—R$^{66}$, or a group —CR$^{67}$=CR$^{68}R^{69}$, in which $R^{60}$ and $R^{61}$, which may be the same or different, are each independently hydrogen or alkyl of 1 to 4 carbon atoms, $R^{62}$ is hydrogen, alkyl of 1 to 5 carbon atoms, aralkyl, —NR$^{63}R^{64}$, or —COR$^{65}$, $R^{63}$ and $R^{64}$, which may be the same or different, are each independently alkyl of 1 to 4 carbon atoms or 3- to 8-membered rings which may contain a hetero atom, $R^{65}$ is alkyl of 1 to 4 carbon atoms or aryl of 6 to 14 carbon atoms, $R^{66}$ is hydrogen or alkyl of 1 to 4 carbon atoms, and $R^{67}$, $R^{68}$ and $R^{69}$, which may be the same or different, are each independently hydrogen or alkyl of 1 to 4 carbon atoms.

52. A resist composition according to claim 10, wherein the amount of component (H) is 5 to 95 parts by weight per 100 parts by weight of alkali soluble resin (G).

* * * * *